(12) United States Patent
Whetsel

(10) Patent No.: US 10,585,144 B2
(45) Date of Patent: *Mar. 10, 2020

(54) ROUTER GATING TDI, TMS INPUTS TO TWO TDI, TMS OUTPUTS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/228,067

(22) Filed: Dec. 20, 2018

(65) Prior Publication Data

US 2019/0120904 A1 Apr. 25, 2019

Related U.S. Application Data

(62) Division of application No. 15/499,362, filed on Apr. 27, 2017, now Pat. No. 10,197,628, which is a
(Continued)

(51) Int. Cl.
*G06F 13/14* (2006.01)
*G01R 31/3185* (2006.01)
(Continued)

(52) U.S. Cl.
CPC . *G01R 31/318597* (2013.01); *G01R 31/3177* (2013.01); *G01R 31/31723* (2013.01);
(Continued)

(58) Field of Classification Search
CPC .......... G01R 31/3177; G01R 31/31855; G01R 31/318558; G01R 31/318533;
(Continued)

(56) References Cited

U.S. PATENT DOCUMENTS 6,014,752 A 1/2000 Hao
6,591,369 B1 7/2003 Edwards
(Continued)

OTHER PUBLICATIONS

"Programming a Flash-Based MSP430 Using the JTAG Interface" by Markus Koesler, Franz Graf, Zack Albus, Sep. 2002.

*Primary Examiner* — Jing-Yih Shyu
(74) *Attorney, Agent, or Firm* — Lawrence J. Bassuk; Charles A. Brill; Frank D. Cimino

(57) ABSTRACT

A falling edge controller includes a controller having an inverted TCK (Test Clock) input, a TMS (Test Mode Select) input, a shift register control output, an update register control output, and a shift output; a shift register having a TDI (Test Data In) input, a shift register control input coupled to the shift register control output, address inputs, a select input, address and select outputs, and a TDO (Test Data Out) output; an update register having address and select inputs coupled to the address and select outputs, an update register control input coupled to the update register control output, address outputs coupled to the address inputs, and a select output coupled to the select input; and address circuitry having address inputs coupled to the address outputs, and having an enable output.

9 Claims, 28 Drawing Sheets

Related U.S. Application Data division of application No. 15/179,117, filed on Jun. 10, 2016, now Pat. No. 9,671,463, which is a division of application No. 14/054,039, filed on Oct. 15, 2013, now Pat. No. 9,395,412, which is a division of application No. 12/968,966, filed on Dec. 15, 2010, now Pat. No. 8,589,714.

(60) Provisional application No. 61/288,055, filed on Dec. 18, 2009.

(51) Int. Cl.
*G01R 31/3177* (2006.01)
*G01R 31/317* (2006.01)

(52) U.S. Cl.
CPC ......... *G01R 31/318552* (2013.01); *G01R 31/318555* (2013.01); *G01R 31/318558* (2013.01)

(58) Field of Classification Search
CPC .... G01R 31/318536; G01R 31/318597; G01R 31/31723
See application file for complete search history.

(56) References Cited

U.S. PATENT DOCUMENTS

| | | |
|---|---|---|
| 6,665,816 B1 | 12/2003 | Edwards |
| 6,681,337 B1 | 1/2004 | Smith |
| 6,804,725 B1 | 10/2004 | Whetsel |
| 6,918,057 B1 | 7/2005 | Brophy |
| 6,944,247 B2 | 9/2005 | Whetsel |
| 7,168,032 B2 | 1/2007 | Roth |
| 7,493,535 B2 | 2/2009 | Whetsel |
| 7,613,970 B2 * | 11/2009 | Whetsel ........... G01R 31/31722 714/729 |
| 2002/0040458 A1 * | 4/2002 | Dervisoglu .... G01R 31/318505 714/729 |
| 2005/0216802 A1 | 9/2005 | Warren |
| 2006/0090109 A1 | 4/2006 | Bonnet |
| 2006/0136165 A1 | 6/2006 | Schuttert |
| 2006/0156112 A1 | 7/2006 | Whetsel |
| 2007/0165759 A1 | 7/2007 | Whetsel |
| 2007/0180341 A1 | 8/2007 | Haroun |
| 2008/0094104 A1 | 4/2008 | Whetsel |
| 2009/0219779 A1 * | 9/2009 | Mao .................... G06F 13/1684 365/233.11 |
| 2009/0235136 A1 | 9/2009 | Whetsel |

* cited by examiner

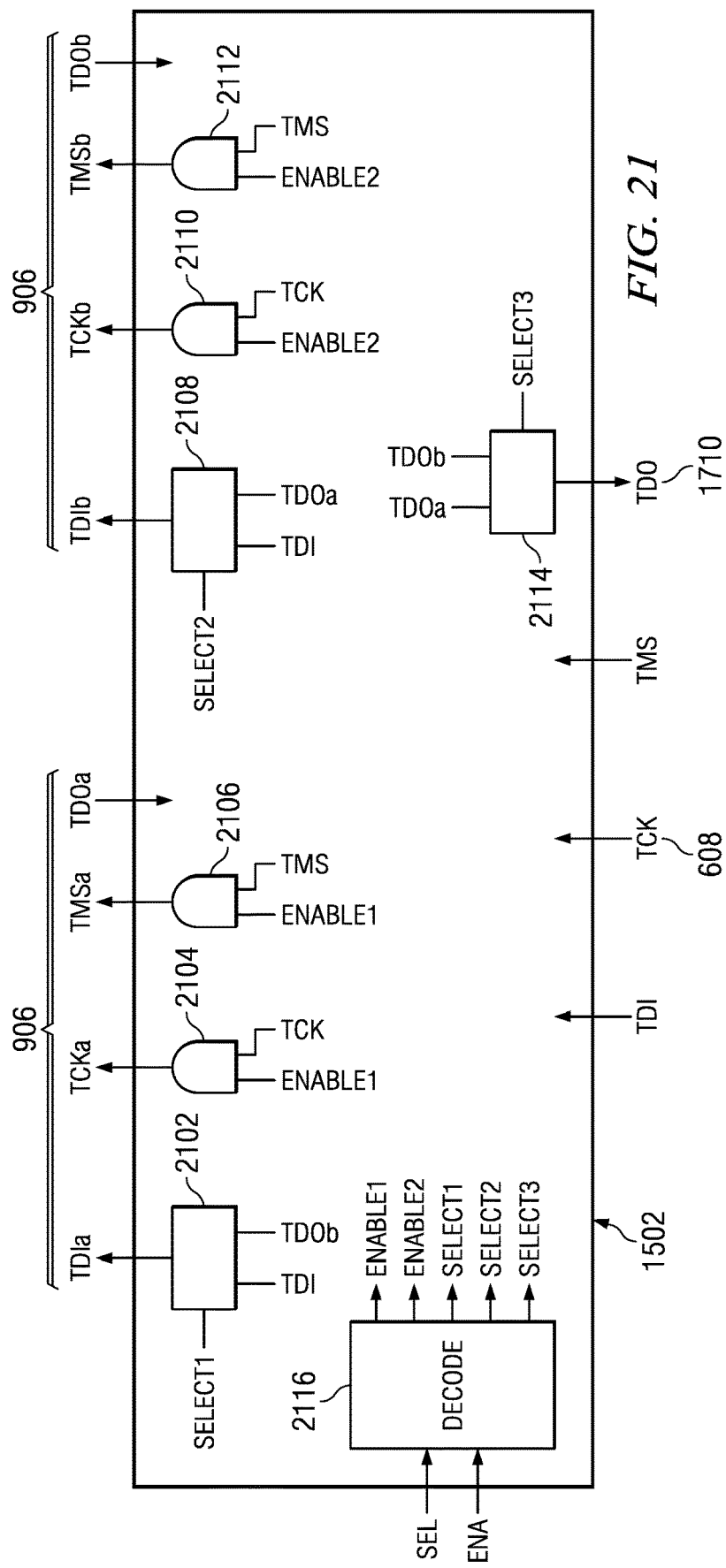

ROUTER GATING TDI, TMS INPUTS TO TWO TDI, TMS OUTPUTS

CROSS REFERENCE TO RELATED PATENTS

This application is a divisional of application Ser. No. 15/499,362, filed Apr. 27, 2017, now U.S. Pat. No. 10,197, 628, issued Feb. 5, 2019;

Which was a divisional of prior application Ser. No. 15/179,117, filed Jun. 10, 2016, now U.S. Pat. No. 9,671, 463, issued Jun. 6, 2017;

Which was a divisional of prior application Ser. No. 14/054,039, filed Oct. 15, 2013, now U.S. Pat. No. 9,395, 412, issued Jul. 19, 2016;

Which was a divisional of prior application Ser. No. 12/968,966, filed Dec. 15, 2010, now U.S. Pat. No. 8,589, 714, issued Nov. 19, 2013;

Which claims priority from Provisional Application No. 61/288,055, filed Dec. 18, 2009.

FIELD OF THE DISCLOSURE

This disclosure relates generally to circuits used to route busses in a system and in particular to circuits used to route JTAG (IEEE 1149.1) busses in a system.

BACKGROUND OF THE DISCLOSURE

Most integrated circuit (IC) devices today include a JTAG (Joint Test Action Group) interface comprising TDI (Test Data In), TCK (Test Data Out), TMS (Test Mode Select), TRST (Test Reset), and TDO (Test Data Out) bus signal terminals. The JTAG interface on the IC device is used for a myriad of purposes including but not limited to; testing purposes, debugging purposes, and programming purposes.

FIG. 1 illustrates a prior art arrangement of a serial string of IC devices 104 on a board 102. Each device 104 includes a JTAG interface comprising a control (C) bus of TCK, TMS, and optional TRST signals, an input (I) bus comprising a TDI signal, and an output (O) bus comprising a TDO signal. The control (C) bus (TCK, TMS, TRST), input (I) bus (TDI), and output (O) bus (TDO) are coupled to a JTAG test access port (TAP) 202 in the device as shown in FIG. 2. The TAP 202 is a well known access port defined in IEEE standard 1149.1 that operates to shift instruction and data patterns into and from the device 104 according to the state diagram of FIG. 4 and timing diagram of FIG. 5. In FIG. 5, the rising edge of the TCK signal times the operation of the TAP, the TMS signal controls the state diagram transitions of the TAP, the TDI signal inputs instruction or data patterns to the TAP, and the TDO signal outputs instruction or data patterns from the TAP. The JTAG interface of the devices 104 are connected in series such that the TAPs 202 of all devices 104 can be accessed at the same time from a JTAG controller 106, via the control (C) bus, input (I) bus, and output (O) bus.

FIG. 3 illustrates a prior art arrangement of boards 102 in a system 302. The boards typically exist in the backplane of the system 302. The boards 102 are connected in series such that the TAPs of all devices 104 on each board 102 can be accessed at the same time from a JTAG controller 106, via the control (C) bus, input (I) bus, and output (O) bus.

As can be seen in FIG. 3, serial arrangements of many boards 102 in a system backplane 302 can problematically extend the access time to the system due to the number of serial bits that must be shifted into and from each board 102 in the system 302 during each JTAG scan operation. Even more problematic, if a board 102 is removed from the system 302 the serial access connection to the JTAG controller 106 is disabled. In response to these system level JTAG scan access problems, JTAG Router devices were developed by National Semiconductor and Texas Instruments that allowed a JTAG controller 106 to directly address and access an individual board 102 in a system 302.

FIG. 6 illustrates the prior art concept of using a JTAG Router 604 to interface a JTAG controller 106 to one or more JTAG device strings 606 on a board 602. Each device string 606 may contain one or more devices 104. In operation, the JTAG controller 106 communicates to the JTAG Router 604 via bus 608 to address it and load selection control to it that selects one or more JTAG device strings 606 for access. The JTAG Router 604 can access one JTAG device string 606 for access or it can serially concatenate and access multiple JTAG device strings 606 together for access. After the addressing and selection control input step, the JTAG controller 106 accesses the selected one or more JTAG device strings 606 via the JTAG Router 604 and bus 608.

FIG. 6A is provided to indicate that a device string 606 may contain only one device 104. This will be the case for all device strings 606 shown in this disclosure.

FIG. 7 illustrates a prior art arrangement of boards 602 in a system 702. The boards 602 typically exist in the backplane of the system 702 so they can be easily removed for replacement or repair. The JTAG interface signals (I, C, O) of each board 602 are connected in parallel such that the each board is coupled to the control (C) bus 608 of the JTAG controller, the input (I) bus 608 of the JTAG controller, and the output (O) bus 608 of the JTAG controller. In this arrangement the JTAG controller can individually address and access any board 602 via the board's JTAG Router 604 and bus 608.

As can be seen in FIG. 7, the problematic scan access time mentioned in regard to serial JTAG access arrangement of FIG. 3 is eliminated since the JTAG controller 106 only performs scan operations to one board 602 at a time, via the board's JTAG Router 604. Also as seen in FIG. 7, the board removal problem mentioned in regard to FIG. 3 is eliminated since any remaining system boards 602 can be directly addressed and accessed by the JTAG controller 106, via the board's JTAG Router 604.

FIG. 8 illustrates a view of a prior art JTAG Router 802 produced by National Semiconductor and referred to as ScanBridge™. The ScanBridge 802 operates to address and select JTAG device strings 606 on boards 602 as described generally in the conceptual JTAG Router descriptions of FIGS. 6 and 7.

FIG. 9 illustrates the ScanBridge circuit 802 in more detail. The ScanBridge includes a Routing Circuit 902 and a JTAG TAP circuit 904. The JTAG TAP circuit 904 has a first set of TDI, TCK, TMS and TDO signals that are coupled to the JTAG controller bus 608, a second set of TDI, TCK, TMS, and TDO signals 910 that are coupled to the Routing Circuit 902, and control (CTL) outputs 912 that are coupled to the Routing Circuit 902. The JTAG TAP circuit 904 contains addressing circuitry that can be loaded by the JTAG controller 106 via bus 608 to address the board 602 and routing control circuitry that can be loaded by the JTAG controller via bus 608 to select one or more JTAG device strings 606 on the board for access. In response to the control (CTL) outputs 912 from the JTAG TAP circuit 904, the Routing Circuit 902 selectively couples the TDI, TCK, TMS, and TDO signals 910 from the JTAG TAP circuit 904 to a selected TDI, TCK, TMS, and TDO signal group 906 that is coupled to a JTAG device string 606. The Routing Circuit 902 may also concatenate multiple JTAG device strings together and couple them to the TDI, TCK, TMS, and TDO signals 910 from the JTAG TAP circuit 904 in response to the control (CTL) outputs 912 so that they can be accessed together.

FIG. 10 illustrates the process of using JTAG scan operations 1002 to access a selected JTAG device string 606 on a board 602. Since the ScanBridge's JTAG TAP circuit 904 lies in series between the JTAG controller 106 and the selected JTAG device string 606, each JTAG scan operation 1002 to the selected JTAG device string 606 must be augmented with instruction and data patterns for the Scan-Bridge JTAG TAP circuit 904. Having to augment each JTAG scan operation 1002 with additional instruction and data patterns for the "in series" JTAG TAP circuit 904 is problematic since it lengthens the access time to the selected JTAG device string 606 and requires modifying the existing JTAG pattern set of the devices in the JTAG device string 606.

FIG. 11 illustrates a view of a prior art JTAG Router 1102 produced by Texas Instruments and referred to as a linking Addressable Scan Port (ASP). The ASP 1102 operates to address and select JTAG device strings 606 on boards 602 as described generally in the conceptual JTAG Router descriptions of FIGS. 6 and 7.

FIG. 12 illustrates the ASP circuit 1102 in more detail. The ASP includes a Routing Circuit 1202 and a Shadow Protocol Controller 1204. The Shadow Protocol Controller 1204 has a set of TDI, TCK, TMS and TDO signals that are coupled to the JTAG controller bus 608, and control (CTL) outputs 1206 that are coupled to the Routing Circuit 1202. The Shadow Protocol Controller 1204 contains addressing circuitry that can be loaded by the JTAG controller 106 via bus 608 to address the board 602 and routing control circuitry that can be loaded by the JTAG controller via bus 608 to select one or more JTAG device strings 606 on the board for access. In response to the control (CTL) outputs 1206 from the Shadow Protocol Controller 1204, the Routing Circuit 1202 selectively couples the TDI, TCK, TMS, and TDO signals from the JTAG controller 106 to a selected TDI, TCK, TMS, and TDO signal group 906 that is coupled to a JTAG device string 606. The Routing Circuit 1202 may also concatenate multiple JTAG device strings together and couple them to the TDI, TCK, TMS, and TDO signals via bus 608 from the JTAG controller 106 in response to the control (CTL) outputs 1206 so that they can be accessed together.

As seen, the Shadow Protocol Controller 1204 does not exist in series in bus 608 between the JTAG controller 106 and the Routing Circuit 1202, but is simply coupled to bus 608. The JTAG controller 106 communicates to the Shadow Protocol Controller 1204 using Shadow Protocol Messages to load board address and device string selection information during times when JTAG bus operations are inactive in the Run Test/Idle, Pause-DR and Pause-IR states of FIG. 4.

FIG. 13 illustrates the process of using Shadow Protocol Messages 1302 and 1304 to access a selected JTAG device string 606 on a board 602. When JTAG bus operations are inactive in one of the states mentioned above, the JTAG controller 106 inputs a Shadow Protocol Message request 1302 to the Shadow Protocol Controller 1204 that contains the board address and device string selection information. In response to the request 1302, the Shadow Protocol Controller 1204 outputs a Shadow Protocol Message acknowledge 1304 to the JTAG controller 106 to confirm the address and selection information, then connects the selected device string 606 to the JTAG controller 106 via bus 608. Following the connect operation, the JTAG controller 106 performs JTAG scan operations 1306 to access the selected device string 606. As can be seen, the JTAG scan operations 1306 only include instruction and data patterns required by the devices in the selected device string 606. Thus the ASP 1102 does not lengthen the access time to the selected JTAG device string 606 and does not require modifying the existing JTAG pattern set of the devices in the JTAG device string 606, as does the ScanBridge 802. However, the Shadow Protocol Messages 1302 and 1304 are based on Manchester-like encoding and decoding, which requires the Shadow Protocol Controller 1204 to be fairly complex which adds to the cost of the ASP device 1102.

BRIEF SUMMARY OF THE DISCLOSURE

This disclosure describes a method and apparatus for allowing a JTAG controller to access JTAG device strings on a board or other substrate using a simplified JTAG Router device that operates on the falling edge of the JTAG TCK signal.

BRIEF DESCRIPTION OF THE VIEWS OF THE DRAWINGS

FIG. 21 illustrates one preferred, but not limited to, example embodiment of the Routing Circuit of the Falling Edge Controller of FIG. 17 according to the disclosure.

FIG. 22 illustrates the operation of the decode circuit 2116 in response to the SEL and ENA signals from Falling Edge Controller 1404.

DETAILED DESCRIPTION OF THE DISCLOSURE

Figure 14:
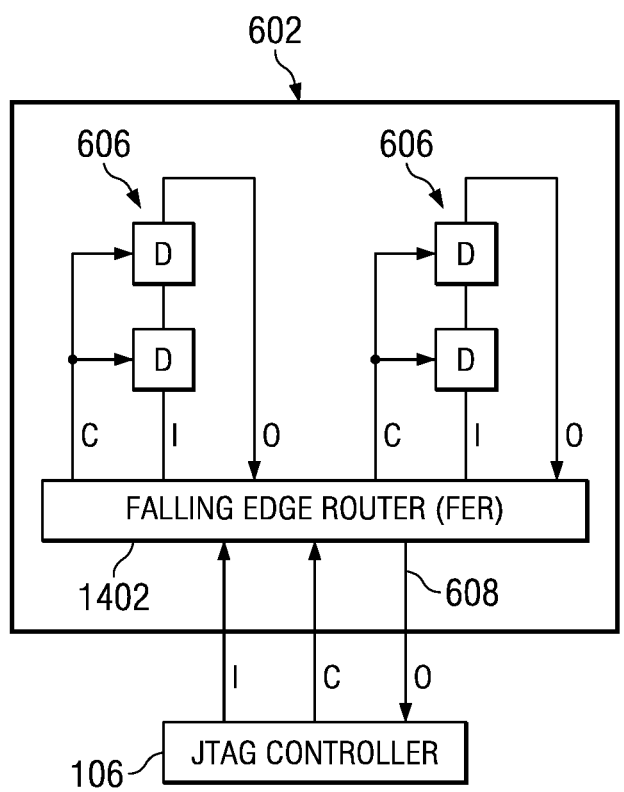
FIG. 14 illustrates an arrangement of strings of one or more IC devices on a board connectable to a JTAG controller via the Falling Edge Router (FER) according to the disclosure.

FIG. 14 illustrates a view of a falling edge bus router 1402, hereafter referred to as a Falling Edge Router (FER), that operates to couple a JTAG controller 106 to a string 606 of one or more IC devices (D) on a board 602, according to the present disclosure. The FER 1402 operates on the falling edge of the TCK to address and select IC device strings 606 on the board 602.

It should be understood that while the board 602 of FIG. 14 is described as being a board with IC device strings 606, the board 602 could also be an IC with strings 606 of one or more embedded core circuit devices or a core circuit with strings 606 of one or more further embedded core circuit devices. This will be the case for other similar example figures in this disclosure.

Figure 15:
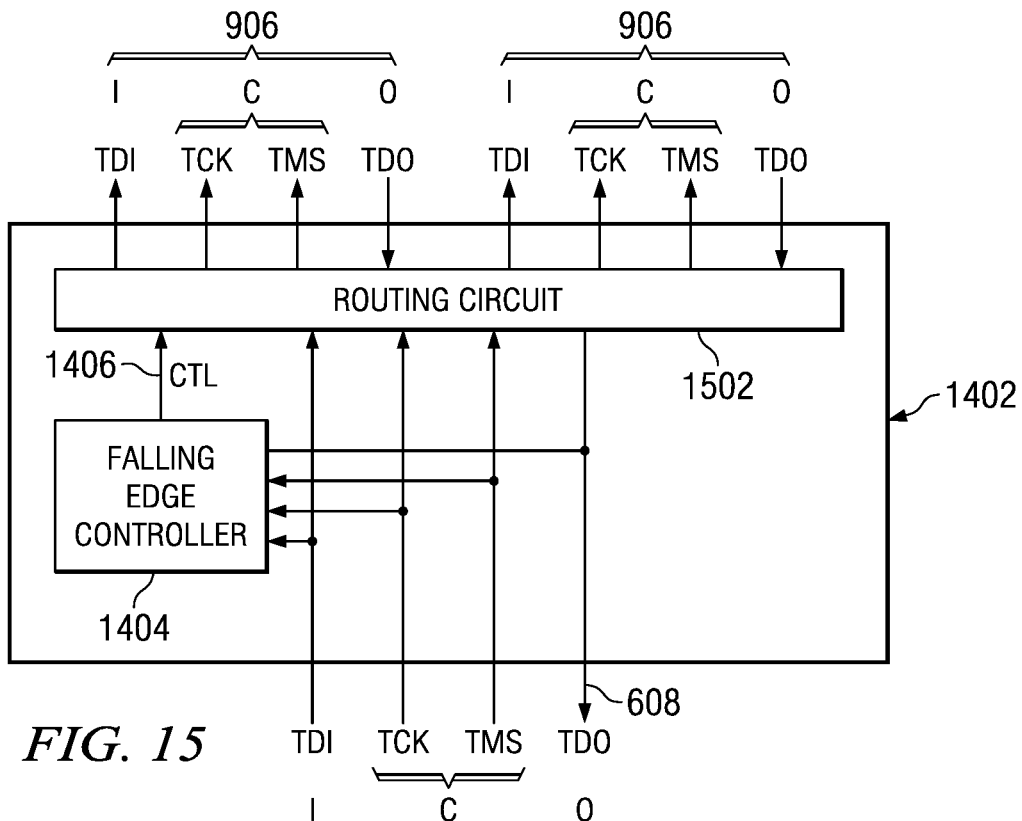
FIG. 15 illustrates a view of the Falling Edge Router according to the disclosure.

FIG. 15 illustrates the FER circuit 1402 in more detail. The FER includes a Routing Circuit 1502 and a Falling Edge Controller 1404. The Falling Edge Controller 1404 has a set of TDI, TCK, TMS and TDO signals that are coupled to the JTAG controller bus 608, and control (CTL) outputs 1406 that are coupled to the Routing Circuit 1502. The Falling Edge Controller 1404 contains addressing circuitry that can be loaded by the JTAG controller 106 via bus 608 to address the board 602 and routing control circuitry that can be loaded by the JTAG controller 106 via bus 608 to select one or more JTAG device strings 606 on the board 602 for access. In response to the control (CTL) outputs 1406 from the Falling Edge Controller 1404, the Routing Circuit 1502 selectively couples the TDI, TCK, TMS, and TDO signals from the JTAG controller 106 to a selected TDI, TCK, TMS, and TDO signal group 906 that is coupled to a JTAG device string 606. The Routing Circuit 1502 may also concatenate multiple JTAG device strings together and couple them to the TDI, TCK, TMS, and TDO signals from the JTAG controller 106 in response to the control (CTL) outputs 1406 so that they can be accessed together.

Figure 1:
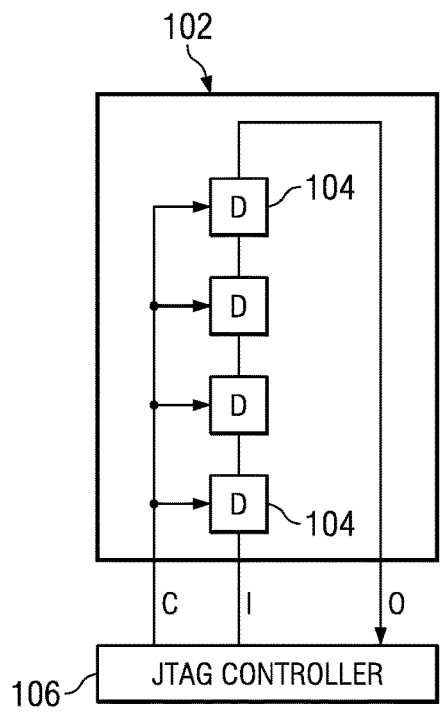
FIG. 1 illustrates a conventional arrangement of IC devices on a board connected to a JTAG controller.
Figure 2:
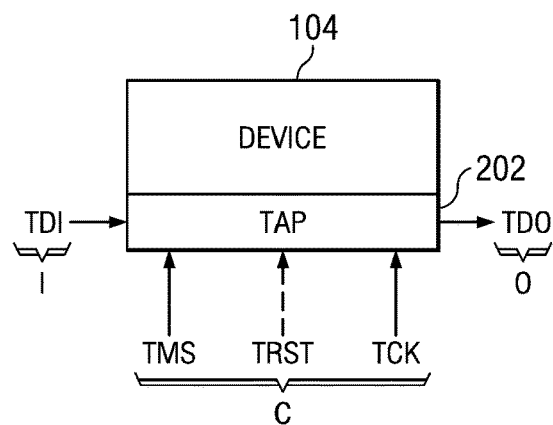
FIG. 2 illustrate a conventional IC device having a JTAG TAP interface.
Figure 3:
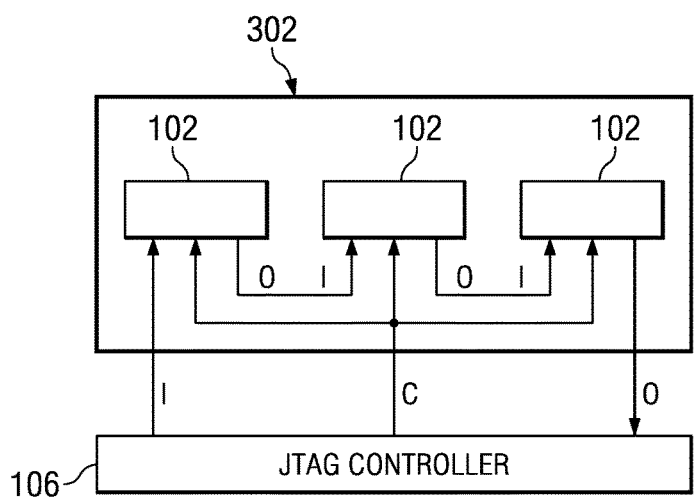
FIG. 3 illustrates a conventional arrangement of boards in a system serially connected to a JTAG controller.
Figure 4:
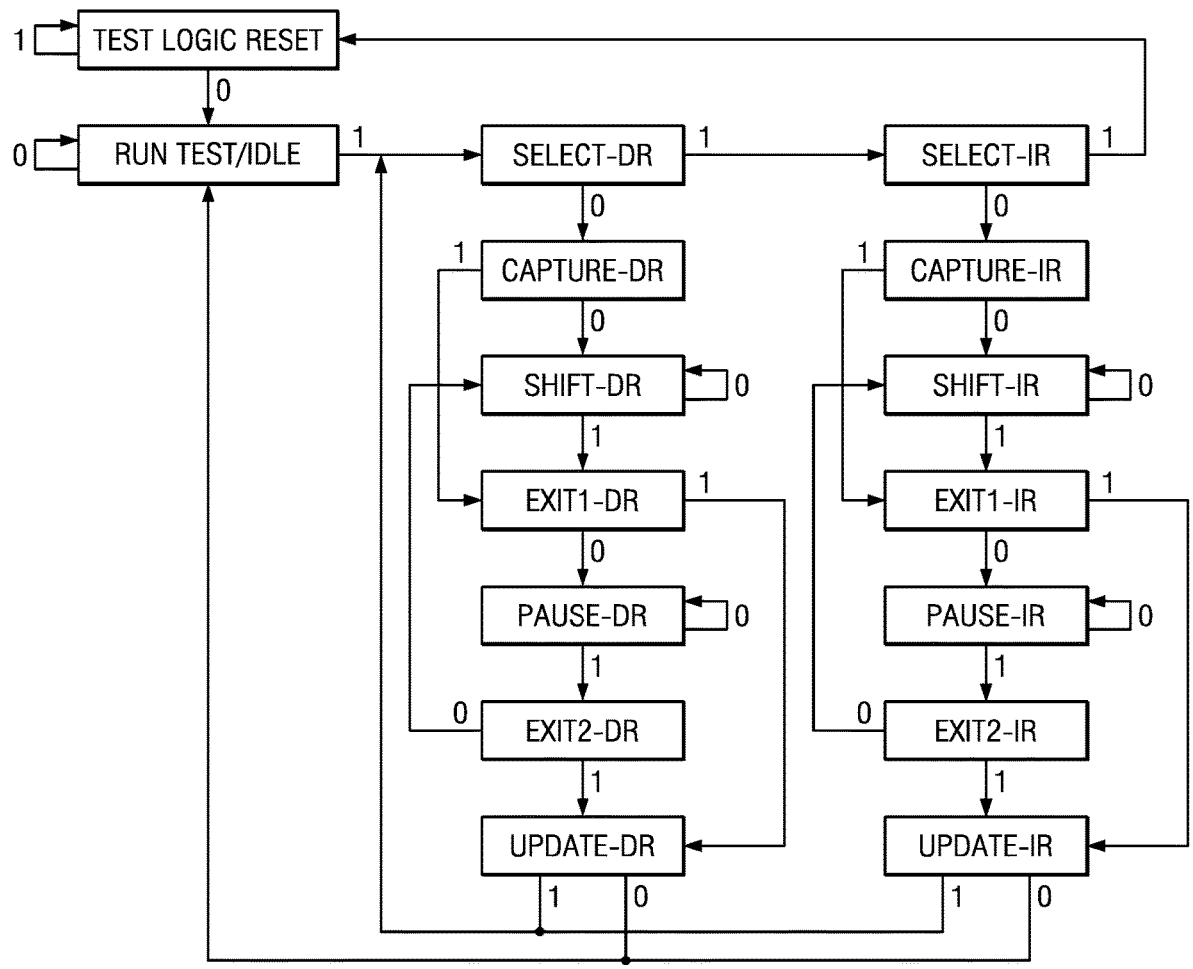
FIG. 4 illustrates a conventional JTAG TAP state diagram.
Figure 5:
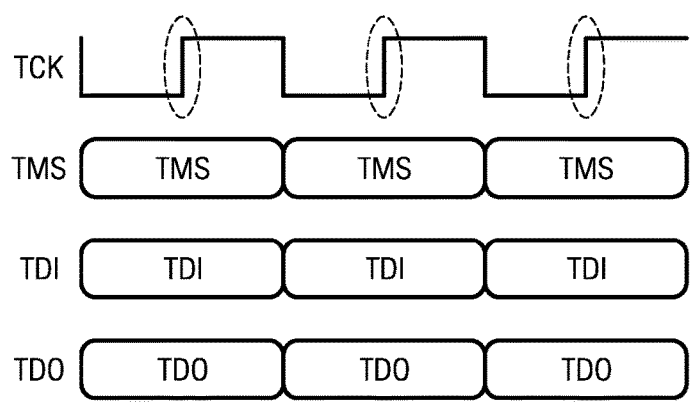
FIG. 5 illustrates a timing diagram of a conventional TAP interface.
Figure 6:
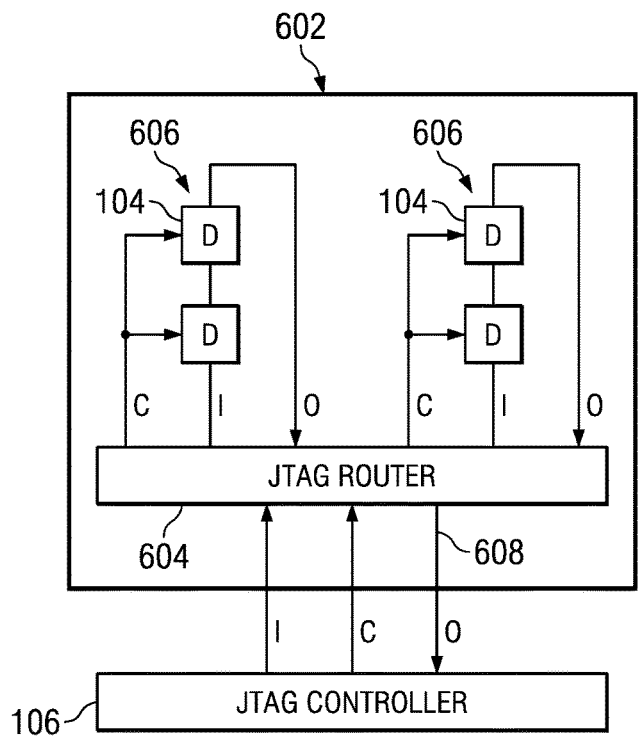
FIG. 6 illustrates a conventional arrangement of strings of IC devices on a board connectable to a JTAG controller via a JTAG router.
Figure 6A:
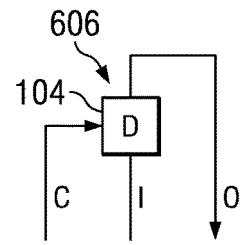
FIG. 6A illustrates a conventional arrangement of a string of one IC Device on a board connectable to a JTAG controller via a JTAG router.
Figure 7:
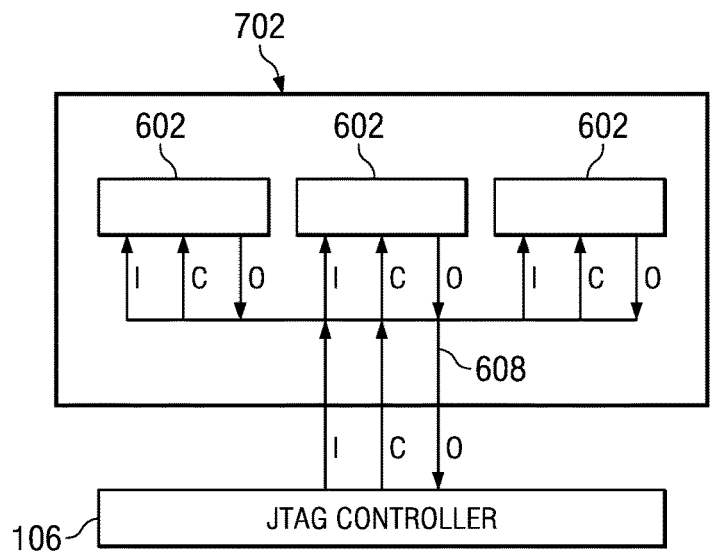
FIG. 7 illustrates a conventional arrangement of boards in a system, each being selectively connected to a JTAG controller.
Figure 8:
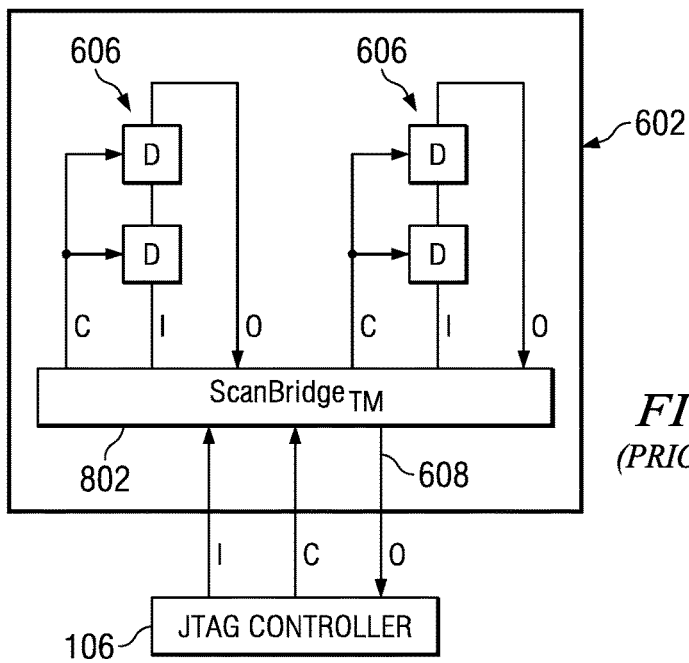
FIG. 8 illustrates a conventional arrangement of strings of one or more IC devices on a board connectable to a JTAG controller via a National Semiconductor ScanBridge™ JTAG router.
Figure 9:
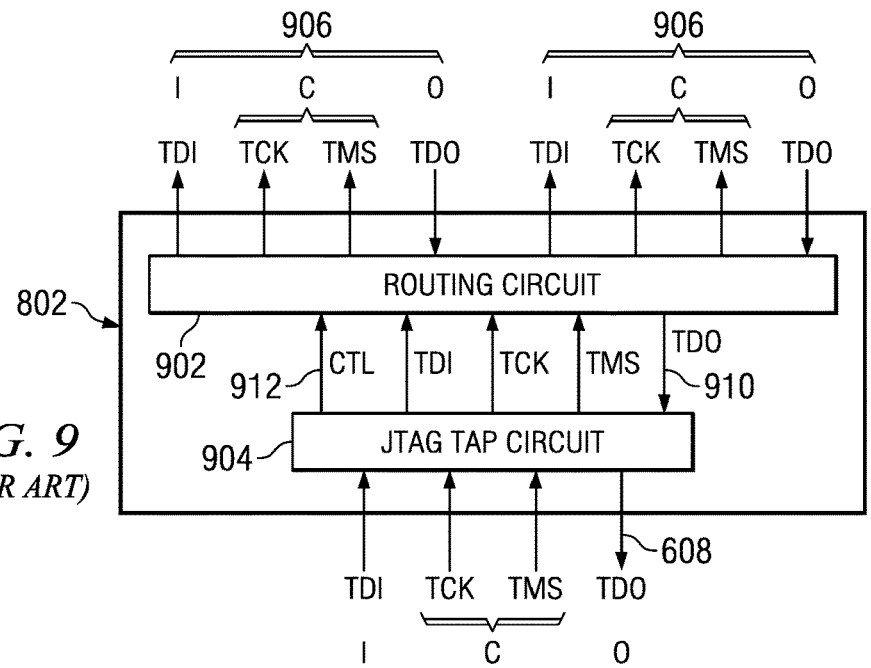
FIG. 9 illustrates a view of the National Semiconductor ScanBridge™ JTAG router.
Figure 10:
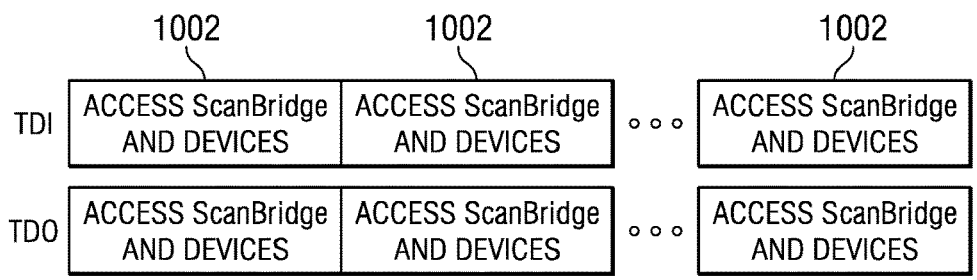
FIG. 10 illustrates the operation of the National Semiconductor ScanBridge™ JTAG router.
Figure 11:
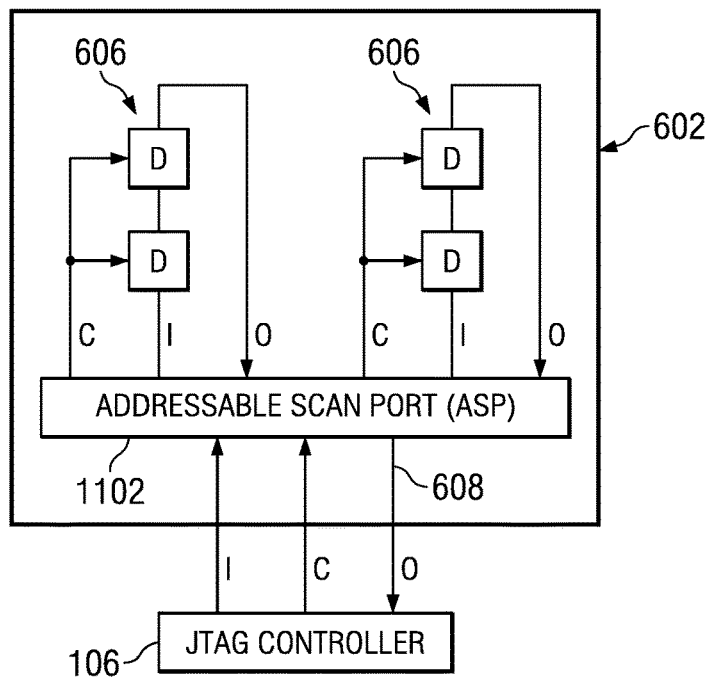
FIG. 11 illustrates a conventional arrangement of strings of one or more IC devices on a board connectable to a JTAG controller via a Texas Instruments Addressable Scan Port (ASP) JTAG router.
Figure 12:
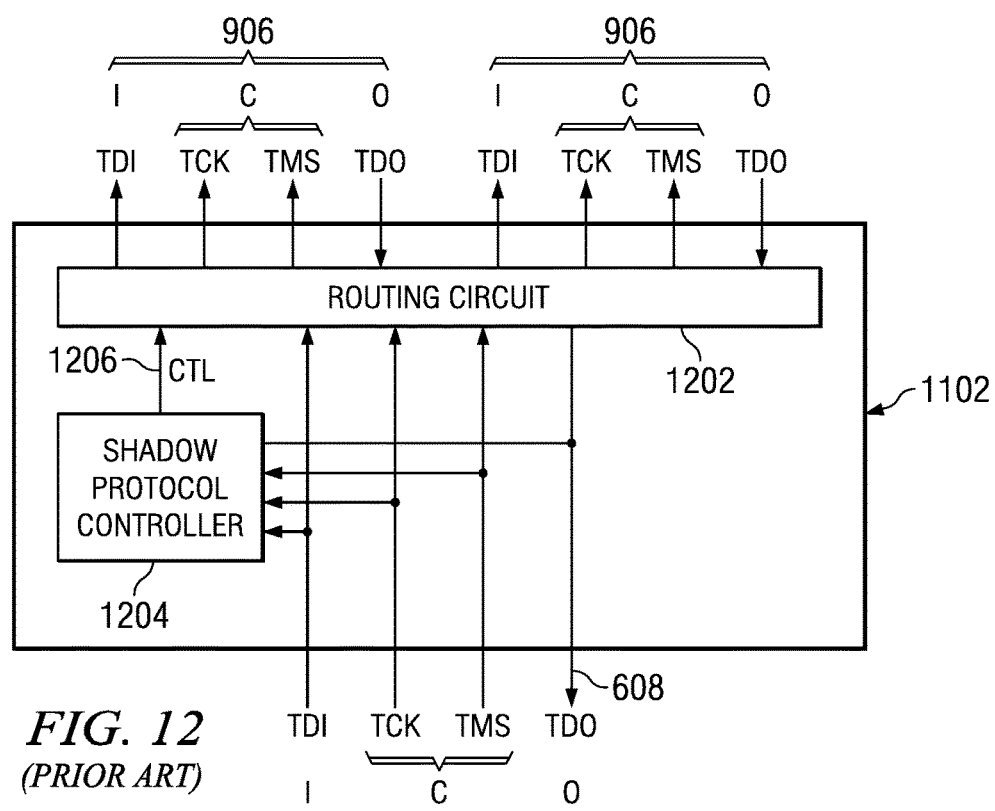
FIG. 12 illustrates a view of the Texas Instruments Addressable Scan Port (ASP) JTAG router.
Figure 13:
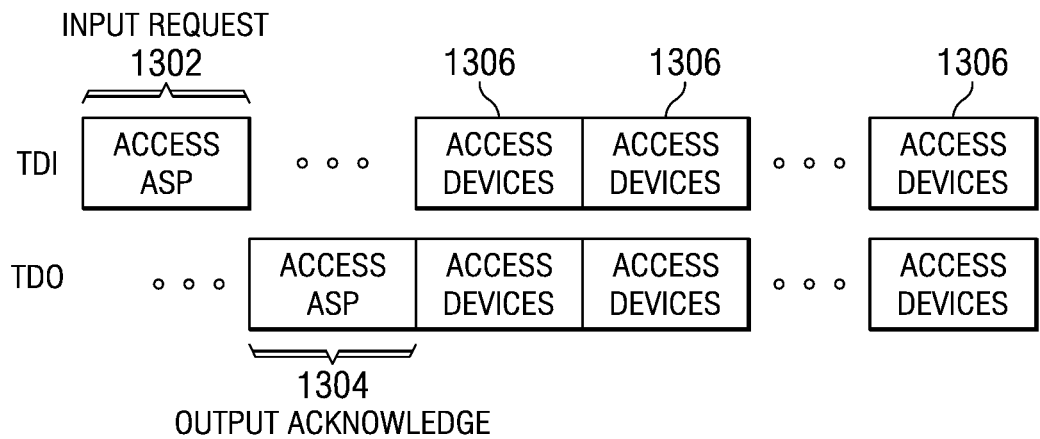
FIG. 13 illustrates the operation of the Texas Instruments Addressable Scan Port (ASP) JTAG router.

As seen, the Falling Edge Controller 1404, like the Shadow Protocol Controller 1204 of ASP 1102, does not exist in series in bus 608 between the JTAG controller 106 and the Routing Circuit 1402, but is simply coupled to bus 608. The JTAG controller 106 communicates to the Falling Edge Controller 1404 using simple falling TCK edge scan operations to load board address and device string selection information during times when JTAG bus operations are inactive in the Run Test/Idle, Pause-DR and Pause-IR states of FIG. 4.

Figure 16:
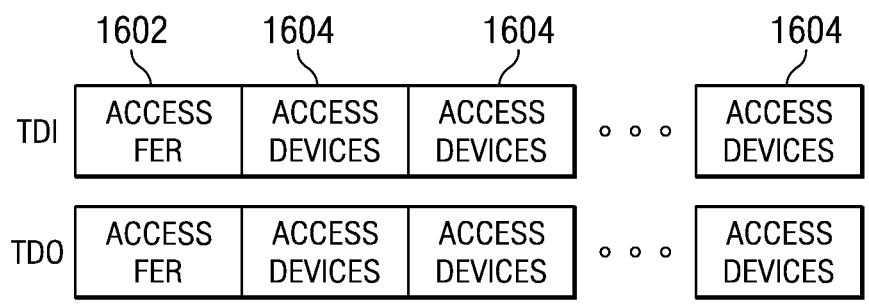
FIG. 16 illustrates the operation of the Falling Edge Router according to the disclosure.

FIG. 16 illustrates the process of using a falling TCK edge scan operation 1602 from a JTAG controller 106 to access a selected JTAG device string 606 on a board 602. When JTAG bus operations are inactive in one of the states mentioned above, the JTAG controller 106 performs the falling edge scan operation 1602 to input board address and device string selection information to the Falling Edge Controller 1404 of FER 1402. In response to the falling edge scan operation 1602, the Falling Edge Controller 1404 outputs control (CTL) 1406 to routing circuit 1502 of FER 1402 to connect the selected device string 606 to the JTAG controller 106 via bus 608. Following the connect operation, the JTAG controller 106 performs rising TCK edge JTAG scan operations 1604 to access the selected device string 606.

As can be seen, the rising TCK edge JTAG scan operations 1604 only include instruction and data patterns required by the devices in the selected device string 606. Thus the FER 1402, like the ASP 1102, does not lengthen the access time to the selected JTAG device string 606 and does not require modifying the existing JTAG pattern set of the devices in the JTAG device string 606, as does the Scan-Bridge 802. Furthermore, since the FER 1402 uses simple falling TCK edge scan operations to address and select a device string 606, the Falling Edge Controller 1404 of the FER 1402 is an extremely simple circuit compared to the ASP's Shadow Protocol Controller 1204, which reduces the cost of the FER device 1402.

Figure 17:
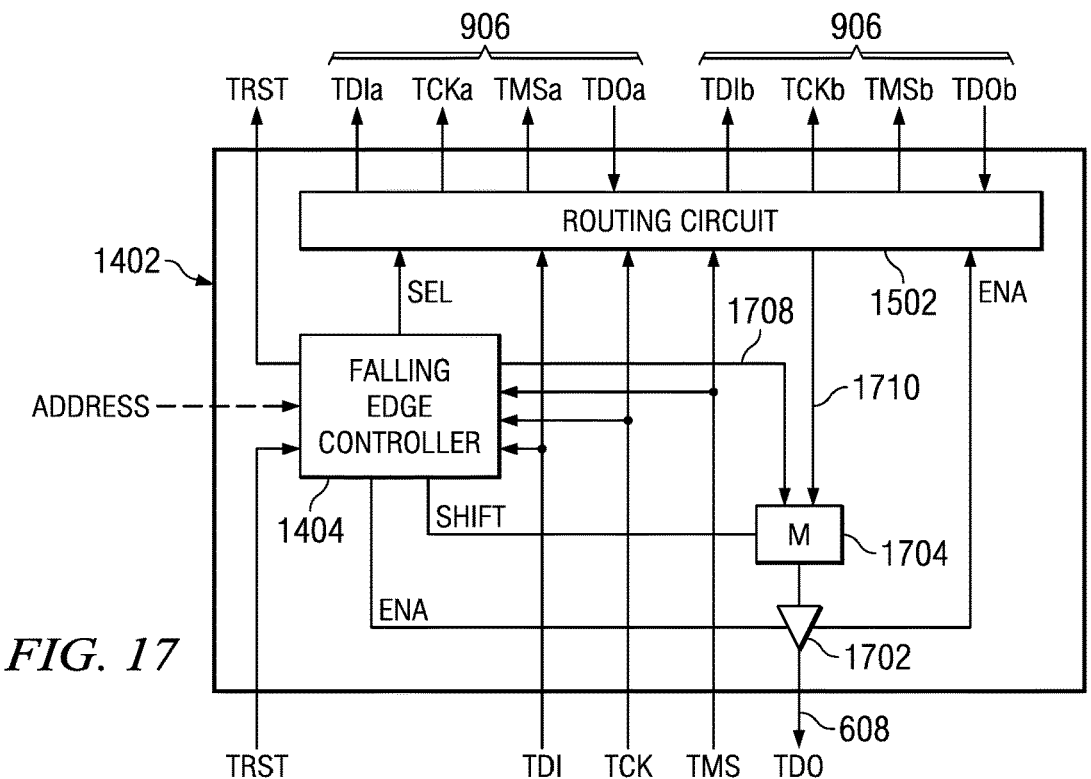
FIG. 17 illustrates one preferred, but not limited to, example embodiment of the Falling Edge Router of FIG. 16 according to the disclosure.

FIG. 17 illustrates one example implementation of FER 1402 according to the present disclosure. However, the disclosure is not limited to only this one implementation example of FER 1402. In this one example, the FER comprises the Falling Edge Controller 1404, the Routing Circuit 1502, a TDO output buffer 1702, and a multiplexer 1704, all connected as shown.

The Falling Edge Controller 1404 has inputs for inputting the TDI, TCK, TMS and optional TRST signals from a JTAG controller 106, via bus 608, and optional external Address signals. The Falling Edge Controller 1404 has outputs for outputting a TDO signal 1708 to multiplexer 1704, a Shift signal to multiplexer 1704, an enable (ENA) signal to TDO buffer 1702 and Routing Circuit 1502, select (SEL) signals to Routing Circuit 1502, and a TRST output signal to devices in JTAG device strings 606. The ENA and SEL signals on control (CTL) bus 1406 of FIG. 15.

The Routing Circuit 1402 has inputs for inputting the TDI, TCK, and TMS signals from bus 608, the SEL and ENA signals from the Falling Edge Controller 1404, a TDOa signal of a bus 906 of a first device string 606, and a TDOb signal of a bus 906 of a second device string 606. The Routing Circuit has outputs for outputting TDIa, TCKa, TMSa signals of the bus 906 of the first device sting 606, TDIb, TCKb, TMSb signals of the bus 906 of the second device sting 906, and a TDO signal 1710 to multiplexer 1704.

Multiplexer 1704 inputs TDO signals 1708 and 1710 and outputs the selected TDO signal to the TDO signal of bus 608 via buffer 1702. The Shift input controls which TDO signal 1708 or 1710 is selected to be output on the TDO signal of bus 608.

While JTAG operations on bus 608 are inactive in the TAP states mentioned above, the Falling Edge Controller 1404 responds to the TMS input on the falling edge of the TCK input to input new address and device string select information on the TDI input and output existing address and device string select information on the TDO signal 1708. If the address data input on TDI matches the address of the Falling Edge Controller 1404, the ENA signal is asserted to enable the TDO output buffer 1702 and the Routing Circuit 1402. While the ENA signal is asserted, the Routing Circuit 1402 responds to the select (SEL) signals from the Falling Edge Controller 1404 to couple bus 608 to a selected one or more device string 606 buses 906. If the address data input on TDI does not match the address of the Falling Edge Controller 1404, the ENA signal is not asserted and the TDO buffer and Routing Circuit are not enabled.

Figure 18:
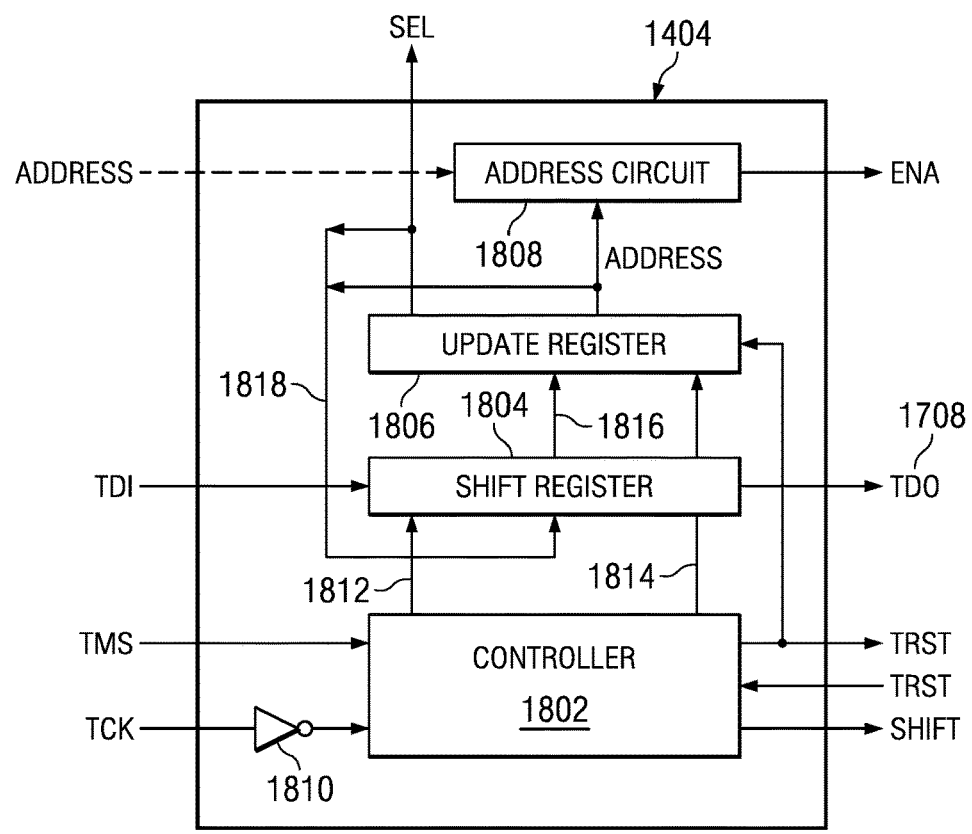
FIG. 18 illustrates one preferred, but not limited to, embodiment of the Falling Edge Controller of the FIG. 17 Falling Edge Router according to the disclosure.

FIG. 18 illustrates one example implementation of the Falling Edge Controller (FEC) 1404 according to the present disclosure. However, the disclosure is not limited to only this one implementation example of FEC 1404. In this one example, the FEC comprises a controller 1802, a shift register 1804, an update register 1806, an address circuit 1808, and TCK inverter 1810, all connected as shown.

The controller 1802 has inputs for inputting the inverted TCK signal from bus 608, the TMS signal from bus 608, and the optional TRST input signal from bus 608. The controller 1802 has outputs for outputting shift register control on bus 1812, update register control on bus 1814, the TRST output signal, and the Shift signal.

The shift register 1804 has inputs for inputting the TDI signal, the control signals 1812 from controller 1802, the address and select (SEL) signals 1818 from the update register 1806 and has outputs for outputting address and select (SEL) signals 1816 to update register 1806 and for outputting data to TDO signal 1708.

The update register 1806 has inputs for inputting the address and select signals 1816 from shift register 1804, the control signals on bus 1814 from controller 1802, the TRST output signal from controller 1802, and has outputs for outputting the address and select (SEL) signals 1816 from shift register 1804.

The address circuit 1808 has inputs for inputting the address signals from update register 1806 and has an output for outputting the ENA signal. The address circuit 1808 may have additional inputs for optionally inputting a desired unique externally supplied address, as shown in dotted line.

Figure 19:
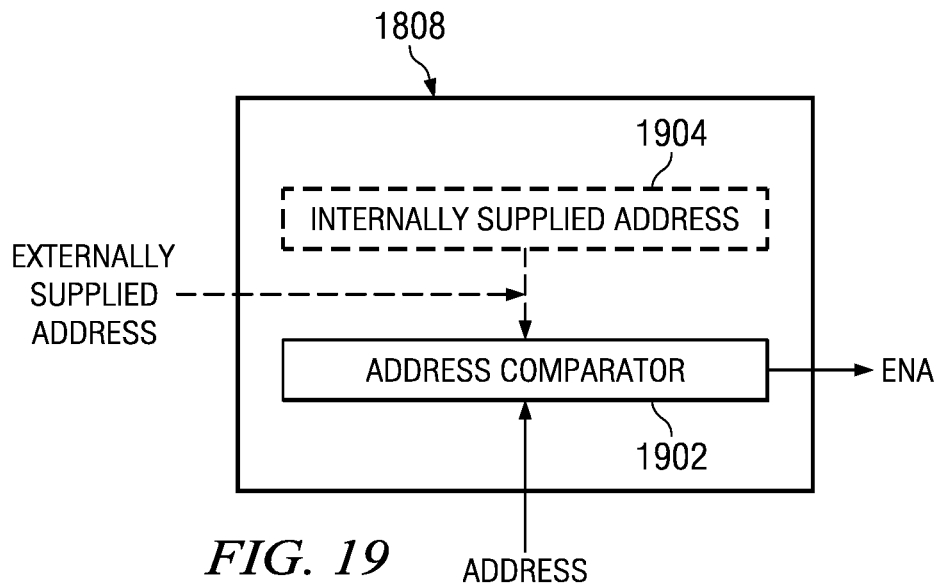
FIG. 19 illustrates one preferred, but not limited to, example embodiment of the Address Circuit of the Falling Edge Controller of FIG. 18 according to the disclosure.

FIG. 19 illustrates one example implementation of the address circuit 1808 according to the present disclosure which comprises an address comparator 1902 and optionally an internally supplied address circuit 1904. Preferably, the internally supplied address circuit 1904 is circuit that can be programmed or otherwise set to a desired unique address. The address comparator 1902 compares the address input from the update register 1806 to the address from the internally supplied address circuit 1904. If the addresses match the ENA signal is asserted. If the addresses do not match the ENA signal is not asserted. As seen in FIG. 19, the internally supplied address may be replaced with the externally supplied address if desired. If an externally supplied address is used the internally supplied address circuit 1904 can be removed from the address circuit 1808.

Figure 20:
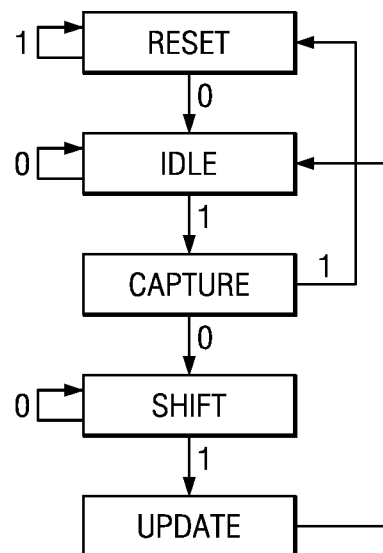
FIG. 20 illustrates one preferred, but not limited to, example of the state diagram of the Controller of the Falling Edge Controller of FIG. 18 according to the disclosure.

FIG. 20 illustrates one example state diagram depicting the operation of controller 1802 comprising a Reset state, an Idle state, a Capture state, a Shift state, and an Update state. The controller 1802 transitions through these states in response the logic state of the TMS signal on the falling edge of the TCK signal. The controller 1802 will be transition to the Reset state if the optional TRST input signal is asserted or after a certain number of logic 1's have been input on the TMS signal.

In the Reset state, the TRST output from the controller is set low. The controller remains in the Reset state while TMS is high. In response to a low on the TRST output, the update register 1806 is reset to an address that does not match the address of the address circuit 1808. Also in response to the low on the TRST output, TAPs 202 of devices 104 on a board are placed in the Test Logic Reset state of FIG. 4. When TMS goes low, the controller transitions from the Reset state to the Idle state.

In the Idle state, the TRST output from the controller 1802 is set high to remove the reset condition from the update register 1806 and device TAPs 202. The controller remains in the Idle state while TMS is low. While in the Idle state, the controller 1802 does not output shift register or update register control on buses 1812 and 1814. The controller transitions from the Idle state to the Capture state when TMS goes high.

In the Capture state, the controller 1802 outputs control to the shift register 1804 on bus 1812 to cause the shift register to capture the address and select information output from the update register 1806 on bus 1818. The controller transitions from the Capture state to the Shift state if TMS is low or transitions to the Reset state if TMS is high.

In the Shift state, the controller 1802 outputs control to the shift register on bus 1812 to cause the shift register to shift input data from the TDI input and shift output data to the TDO signal 1708. The controller remains in the shift State while TMS is low and transitions to the Update state when TMS goes high. The data shifted in on TDI is the new address and select information to be updated to update register 1806 and the data shifted out on TDO is the current address and select information contained in the update register 1806. If the FER's Falling Edge Controller 1404 is not currently addressed or has been reset, the ENA output signal from the Address Circuit 1808 will not be asserted to enable the Routing Circuit 1502 or TDO output buffer 1702 signal. In this condition, the address and selection information on the TDO signal 1708 will not be output on the TDO signal of bus 608 since the output of TDO buffer 1702 is tri-state. If the FER's Falling Edge Controller 1404 is currently addressed the ENA signal will be asserted to enable TDO buffer 1702 to output the address and selection information from TDO signal 1708 to the TDO signal of bus 608.

In the Update state, the controller 1802 outputs control to the update register 1806 on bus 1814 to cause the update register to load the address and select information on bus 1816 that was shifted into the shift register 1804 during the Shift state. From the Update state, the controller 1802 transitions back to the Idle state to wait for the next capture, shift and update operation.

As seen in the state diagram of FIG. 20, the controller 1802 will transition to the Reset state from any other state if the TMS signal is set high for a number of falling edge TCK inputs.

FIG. 21 illustrates one example implementation of Routing Circuit 1502 according to the present disclosure. However, the disclosure is not limited to only this one implementation example of Routing Circuit 1502. In this example, the Routing Circuit comprises; (1) a multiplexer 2102 for coupling TDI or TDOb to TDIa in response to a Select1 signal, (2) a gate 2104 for coupling TCK to TCKa in response to an Enable1 signal, (3) a gate 2106 for coupling TMS to TMSa in response to the Enable1 signal, (4) a multiplexer 2108 for coupling TDI or TDOa to TDIb in response to a Select1 signal, (5) a gate 2110 for coupling TCK to TCKb in response to an Enable2 signal, (6) a gate 2112 for coupling TMS to TMSb in response to the Enable 2 signal, (7) a multiplexer 2114 for coupling TDOa or TDOb to TDO 1710 in response to a Select3 signal, and a decode circuit 2116 having inputs for the SEL and ENA signals and outputs for the Enable1, Enable2, Select1, Select1, and Select3 signals. While this example shows gating both the TCKa and TMSa signals, gating of only the TCKa signal or only the TMSa signal may be used. Likewise gating of only the TCKb signal or only the TMSb signal may be used.

While the Routing Circuit 1502 of FIG. 21 is shown to couple bus 608 to a selected device string bus 906 using gating and multiplexing circuits, registration circuitry can be incorporated in the Routing Circuit 1502 to allow pipelining of the data (TDI and TDO) and control (TMS) signals between coupled buses.

FIG. 22 illustrates the operation of the decode circuit 2116 in response to the SEL and ENA signals from Falling Edge Controller 1404.

If ENA is low the TCKa and/or TMSa signals are set low by the Enable1 signal and the TCKb and/or TMSb signals are set low by the Enable2 signal. In this condition access to the device strings 606 coupled to bus "a" 906 and bus "b" 906 is disabled.

If ENA is high and SEL is set to a first pattern (00) TDI is coupled to TDIa by Select1, TCK is coupled to TCKa by Enable1, TMS is coupled to TMSa by Enable1, TDOa is coupled to TDO 1710 by Select3, and TCKb and TMSb are set low by Enable2. In this condition access to the device string 606 coupled to bus "a" 906 is enabled and access to the device string 606 coupled to bus "b" 906 is disabled.

If ENA is high and SEL is set to a second pattern (01) TDI is coupled to TDIb by Select2, TCK is coupled to TCKb by Enable2, TMS is coupled to TMSb by Enable2, TDOb is coupled to TDO 1710 by Select3, and TCKa and TMSa are set low by Enable1. In this condition access to the device string 606 coupled to bus "b" 906 is enabled and access to the device string 606 coupled to bus "a" 906 is disabled.

If ENA is high and SEL is set to a third pattern (10) TDI is coupled to TDIa by Select1, TCK is coupled to TCKa and TCKb by Enable1 and Enable2, TMS is coupled to TMSa and TMSb by Enable1 and Enable2, TDOa is coupled to TDIb by Select2, and TDOb is coupled to TDO 1710 by Select3. In this condition access to both device strings 606 coupled to buses "a" and "b" 906 are enabled and placed in a serial arrangement, with device string 606 of bus "a" 906 being the first device string 606 in the serial arrangement.

If ENA is high and SEL is set to a fourth pattern (11) TDI is coupled to TDIb by Select2, TCK is coupled to TCKa and TCKb by Enable1 and Enable2, TMS is coupled to TMSa and TMSb by Enable1 and Enable2, TDOb is coupled to TDIa by Select1, and TDOa is coupled to TDO 1710 by Select3. In this condition access to both device strings 606 coupled to buses "a" and "b" 906 are enabled and placed in a serial arrangement, with device string 606 of bus "b" 906 being the first device string 606 in the serial arrangement.

Figure 23:
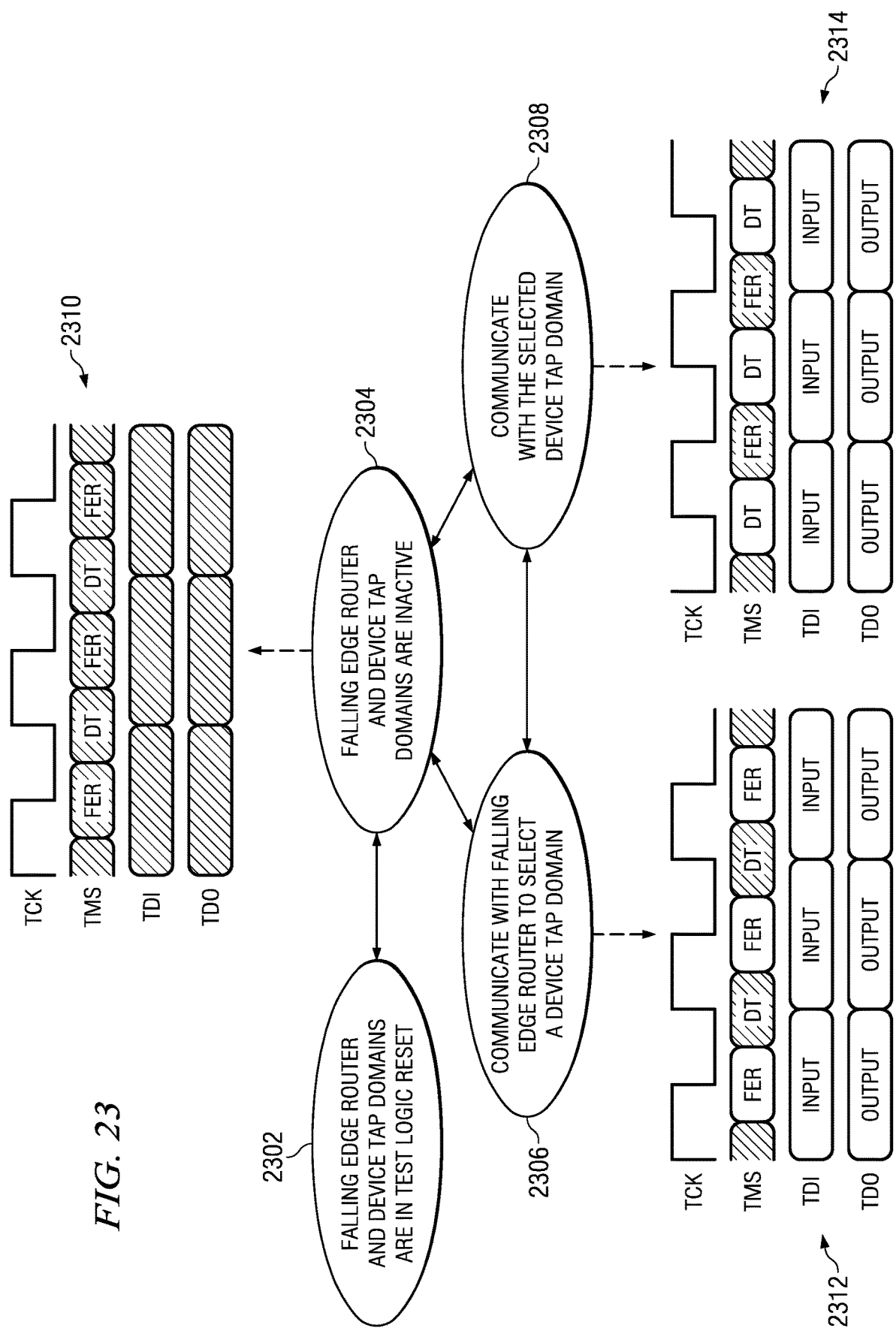
FIG. 23 illustrates one preferred, but not limited to, example of the operational states and timing of the Routers and TAP domains of FIG. 17 according to the disclosure.

FIG. 23 is provided to illustrate the operational states and timing of the FER 1402 and the device TAPs (DT) 202 in device string domains 606 of FIG. 14. The operational states consist of; (1) a state 2302 where both the FER 1402 and DTs 202 are in a reset state (DTs in the Test Logic Reset state of FIG. 4 and the FER in the Reset state of FIG. 20) in response to the TRST signal or logic values input on TMS, (2) a state 2304 where both the FER 1402 and the DTs 202 are in an idle state (DTs in the Run Test/Idle, Pause-DR or Pause-IR state of FIG. 4 and the FER in the Idle state of FIG. 20) in response to logic values input on TMS, (3) a state 2306 where communication occurs to the FER 1402 while the DTs are idle in response to logic values input on TMS, and (4) a state 2308 where communication occurs to the DTs 202 while the FER is idle in response to logic values input on TMS.

Timing diagram 2310 illustrates that logic values input on TMS, indicated by darkened time slots, during the rising and falling edges of TCK in state 2304 maintain the FER 1402 and DTs 202 in idle state 2304. In the idle state 2304, no data input or data output occurs on TDI and TDO respectively, also indicated by darkened fill in timing diagram 2310.

Timing diagram 2312 illustrates that logic values input on TMS (not darkened) during the falling edge of TCK in state 2306 enables the FER 1402 to input data from TDI and output data on TDO, while idle values on TMS (darkened) are input during the rising edge of TCK in state 2306 to maintain the DTs 202 in an idle state.

Timing diagram 2314 illustrates that logic values input on TMS (not darkened) during the rising edge of TCK in state 2308 enables the DTs 202 to input data from TDI and output data on TDO, while idle values on TMS (darkened) are input during the falling edge of TCK in state 2308 to maintain the FER 1402 in the idle state.

Figure 24:
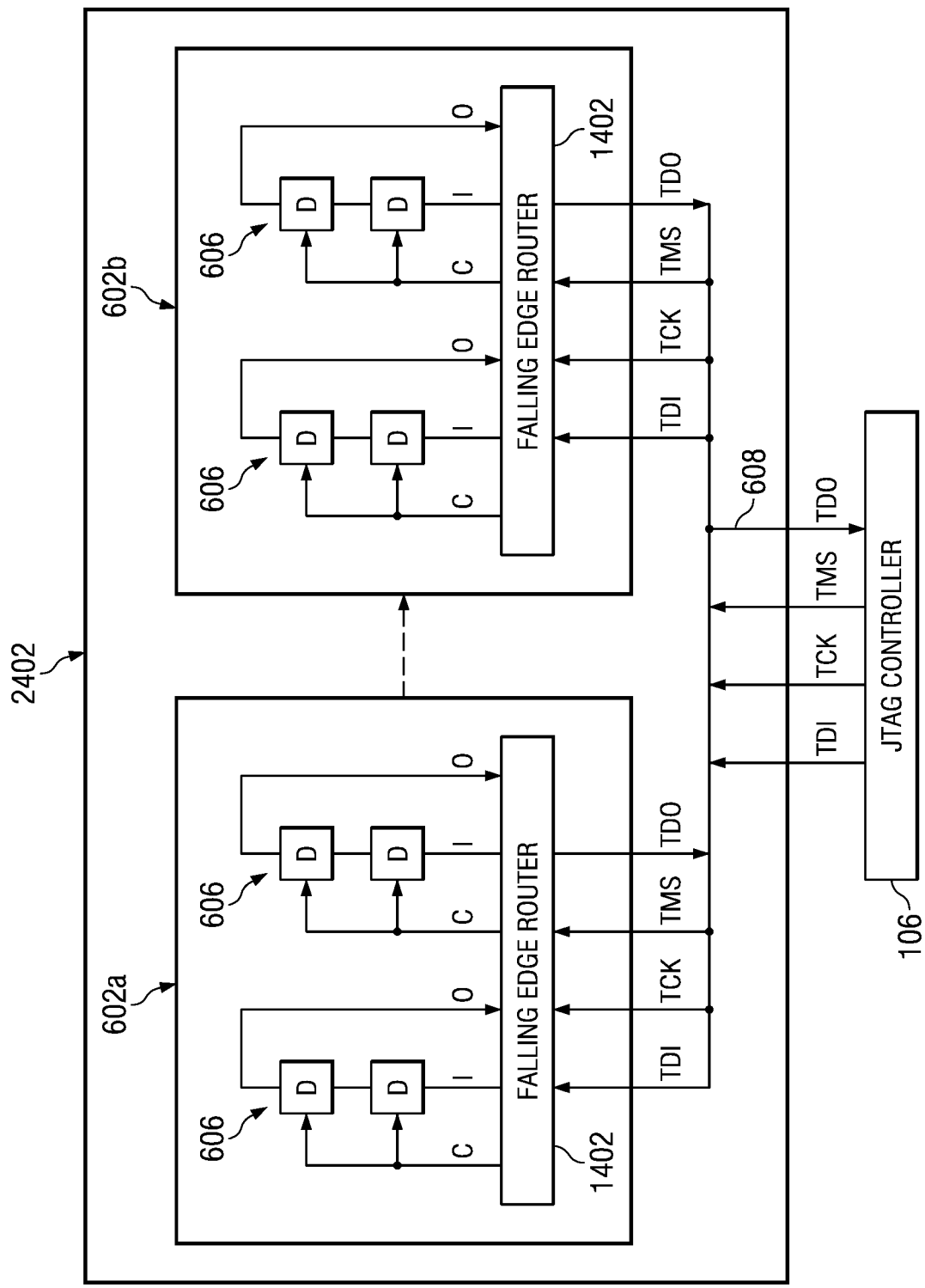
FIG. 24 illustrates a system comprising Falling Edge Router equipped sub-systems coupled to a JTAG controller according to the disclosure.

FIG. 24 illustrates an example system 2402 comprising multiple boards 602a-602b. Each board contains a FER 1402 coupled to JTAG device strings 606. The TDI input signal of the FERs of boards 602a and 602b are connected together and to a TDI output signal from a JTAG controller 106 via bus 608. The TCK input signal of the FERs of boards 602a and 602b are connected together and to a TCK output signal from the JTAG controller 106 via bus 608. The TMS input signal of the FERs of boards 602a and 602b are connected together and to a TMS output signal from the JTAG controller 106 via bus 608. The TDO output signal of the FERs of boards 602a and 602b are connected together and to a TDO input signal to the JTAG controller 106 via bus 608. While not shown the FERs of boards 602a and 602b may each include optional TRST input signals which are connected together and to a TRST output signal from the JTAG controller 106 via bus 608. Each FER 1402 is addressable by a unique internally or externally supplied address, as describe in FIGS. 18-20.

It should be understood that while the system 2402 of FIG. 24 is described as being a system containing multiple FER 1402 equipped boards 602a-602b, the system 2402 could also be any type of higher level electrical system containing multiple FER 1402 equipped lower level electrical subsystems 602a-602b, such as an IC containing multiple FER 1402 equipped embedded core circuits 602a-602b or a core circuit containing multiple FER 1402 equipped further embedded core circuits 602a-602b. This will be the case in other similar example figures of this disclosure.

When the JTAG controller 106 needs to access a JTAG device string 606 on a first one of the boards 602a-602b, it performs a first falling edge scan operation, as described in regard to FIGS. 18-20, to the FERs 1402 of boards 602a-602b. The first falling edge scan operation loads address and device string selection information into the update registers 1806 of each FER 1402. The FER that has an address that matches the address loaded into the update register 1806 becomes enabled to allow the JTAG controller 106 to access the selected JTAG device string 606 of the enabled FER 1402 using JTAG scan operations.

When the JTAG controller 106 needs to access a JTAG device string 606 on a second one of the boards 602a-602b, it performs a second falling edge scan operation, as described in regard to FIGS. 18-20, to the FERs 1402 of boards 602a-602b. The second falling edge scan operation loads address and device string selection information into the update registers 1806 of each FER 1402. The FER 1402 having an address that matches the address loaded into the update register 1806 becomes enabled to allow the JTAG controller 106 to access the selected JTAG device string 606 of the enabled FER 1402 using JTAG scan operations.

When the JTAG controller 106 needs to access a JTAG device string 606 on a third one of the boards 602a-602b, it performs a third falling edge scan operation, as described in regard to FIGS. 18-20, to the FERs 1402 of boards 602a-602b. The third falling edge scan operation loads address and device string selection information into the update registers 1806 of each FER 1402. The FER 1402 having an address that matches the address loaded into the update register 1806 becomes enabled to allow the JTAG controller 106 to access the selected JTAG device string 606 of the enabled FER 1402 using JTAG scan operations.

Assuming that prior to the first falling edge scan operation mentioned above none of the Routers 1402 were enabled, the first falling edge scan operation would input new address and selection information to the shift registers 1804 of all Routers 1402 from TDI but none of the Routers 1402 would be able to output their existing address and selection information from their shift register 1804 on TDO. This is because the ENA signal of the Falling Edge Controllers 1404 of each Router 1402 is not asserted to enable the Router's TDO output buffer 1702, as described in regard to FIG. 17-20.

During the second falling edge scan operation mentioned above, all Routers 1402 will input new address and select information from TDI and the Router enabled by the first falling edge scan operation will output its existing address and selection information on TDO, since its ENA signal was asserted following the first falling edge scan operation.

During the third falling edge scan operation mentioned above, all Routers 1402 will input new address and select information from TDI and the Router enabled by the second falling edge scan operation will output its existing address and selection information on TDO, since its ENA signal was asserted following the second falling edge scan operation.

From the above it is seen that each falling edge scan operation, except for the first one, inputs new address and selection information to all Routers 1402 from the JTAG controller 106 while the currently enabled Router 1402 outputs its existing address and selection information to the JTAG controller 106. Thus each time the JTAG controller performs a falling edge scan operation it can inspect the address and selection information it receives on TDO to verify that the address and selection information received was from a currently enabled Router 1402.

In FIG. 24, if the system 2402 contains a reasonable number of boards 602a-602b the JTAG controller 106 can operate bus 608 to access the selected board at a reasonable communication bandwidth. However if a large number of boards 602a-602b exists in system 2402, excessive loading will occur on bus 608, due to the large number of FERs 1402 connected to bus 608. This excessive loading will reduce the communication bandwidth between the JTAG controller 106 and selected board to unacceptable levels. A solution to the bus 608 loading problem is described in FIGS. 25 and 26 below.

Figure 25:
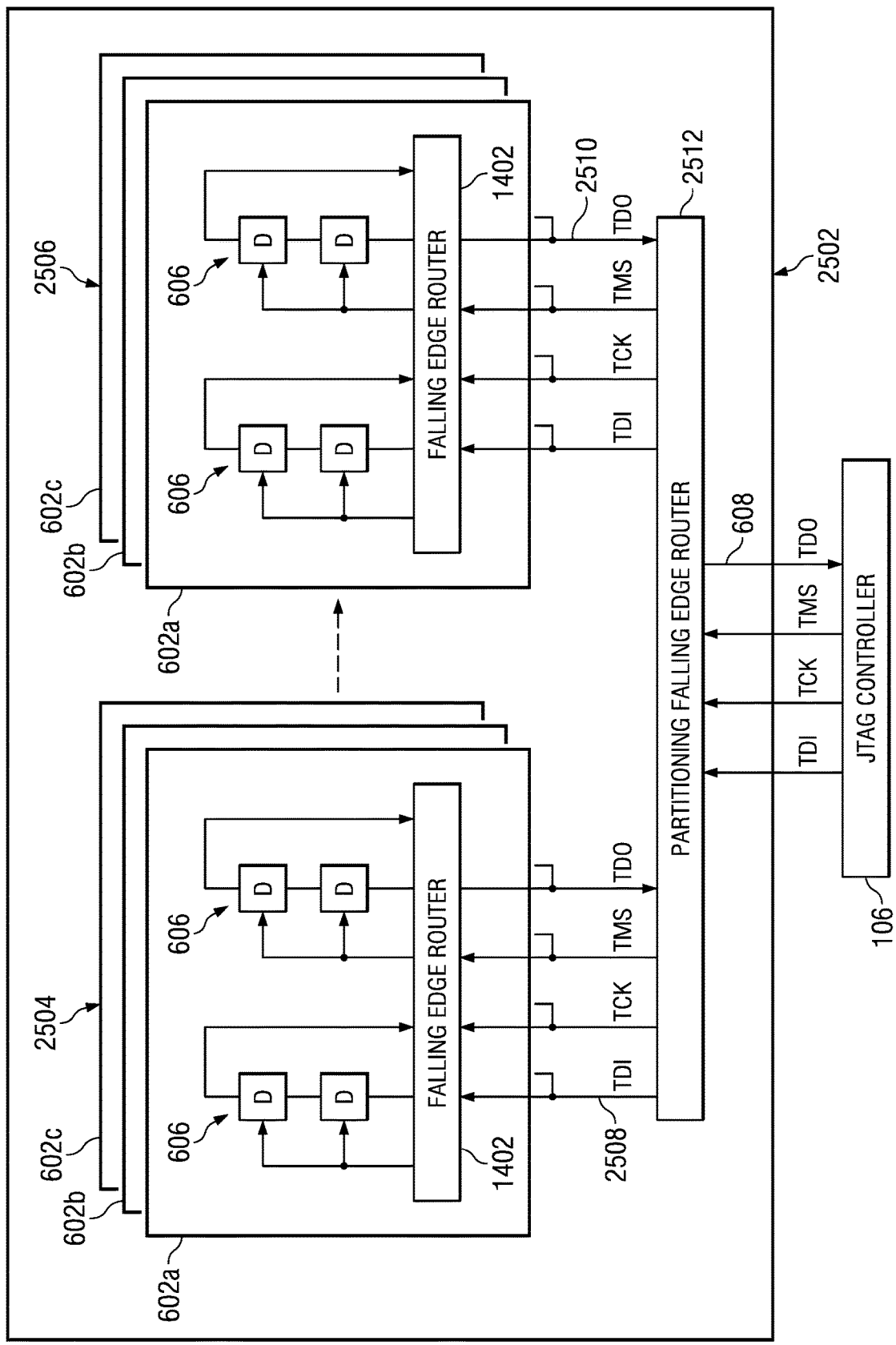
FIG. 25 illustrates a system comprising groups of Falling Edge Router equipped sub-systems coupled to a JTAG controller via a Partitioning Falling Edge Router according to the disclosure.

FIG. 25 illustrates an example system 2502 comprising multiple boards 602a-602c arranged in separate board groups 2504-2506. Each board group 2504-2506 has a separate JTAG bus 2508-2510 that is coupled to a device referred to as a Partitioning Falling Edge Router (PFER) 2512. The PFER 2512 is interfaced to a JTAG controller 106 via JTAG bus 608. The PFER 2512 can have any number of separate JTAG buses 2508-2510 interfaced to any number of separate board groups 2504-2506. As can be seen, the PFER 2512 allows systems 2502 with large numbers of boards 602a-602c to partition the boards into a separate board groups 2504-2506, each group containing only a subset of the overall number of system boards. The JTAG controller 106 can access the JTAG bus 2508-2510 of any board group 2504-2506 by communication to the PFER 2512. Thus the PFER 2512 solves the system bus 608 loading problem mentioned above by providing separate low load busses 2508-2510 to separate system board groups 2504-2506.

It should be understood that while the system 2502 of FIG. 25 is described as being a system containing multiple FER 1402 equipped board groups 2504-2506 coupled to a PFER 2512, the system 2502 could also be; (1) a board containing multiple FER 1402 equipped IC groups 2504-2506 coupled to a PFER 2512, (2) an IC containing multiple FER 1402 equipped embedded core circuit groups 2504-2506 coupled to a PFER 2512, or (3) a core circuit containing multiple FER 1402 equipped further core circuit groups 2504-2506 coupled to a PFER 2512. This will be the case for other similar figures in this disclosure.

Figure 26:
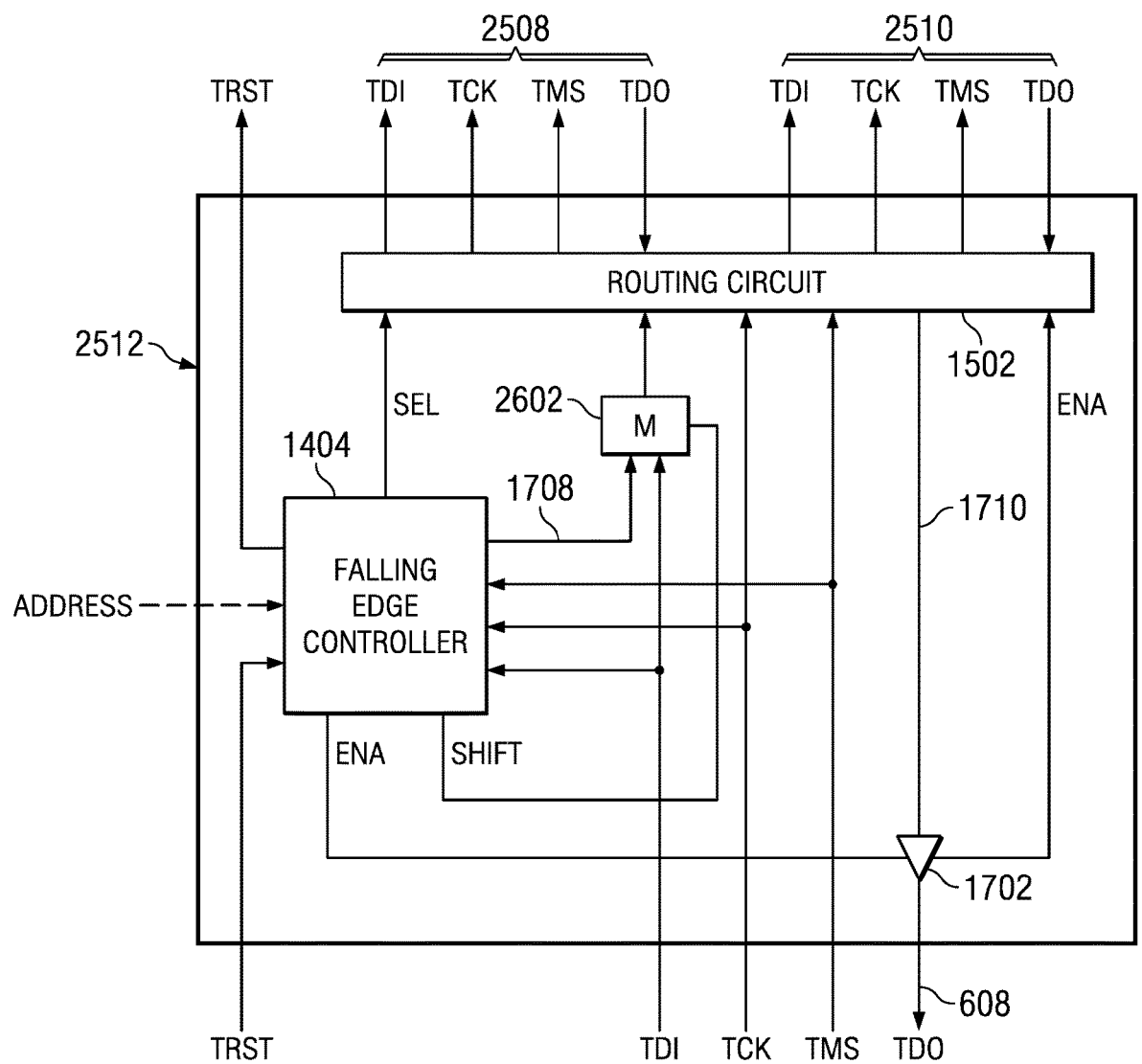
FIG. 26 illustrates one preferred, but not limited to, example embodiment of the Partitioning Falling Edge Router of FIG. 25 according to the disclosure.

FIG. 26 illustrates an example implementation of PFER 2512. The PFER 2512 is the same as the FER 1402 of FIG. 17 with the exceptions that; (1) multiplexer 1704 has been removed from the TDO output path from the Routing Circuit 1502 which allows the TDO output 1710 from the Routing Circuit to be directly input to TDO buffer 1702, and (2) a multiplexer 2602 has been inserted in the TDI input path to the Routing Circuit 1502. Multiplexer 2602 inputs the TDI input signal from bus 608, the TDO signal 1708 from the shift register 1804 of Falling Edge Controller 1404, the Shift signal from the Falling Edge Controller 1404, and outputs a TDI signal to the Routing Circuit 1502.

During falling edge scan operations, TDI data is shifted into the shift register 1804 of Falling Edge Controller 1404 and TDO data 1708 is shifted from the shift register 1804. During shifting, multiplexer 2602 is controlled by the Shift signal to allow the TDO signal 1708 from the Falling Edge Controller's shift register to be input to the Routing Circuit 1502. The TDO signal 1708 input to the Routing Circuit from multiplexer 2602 is output on the TDI data output of one or more JTAG buses 2508-2510. Also during the falling edge scan operation, the TDO of bus 608 is driven by the TDO signal 1710 from a currently selected FER 1402 of one of the JTAG buses 2508-2510.

Referring back to FIG. 25, it can be seen that when the JTAG controller 106 performs a falling edge scan operation, TDI data from the JTAG controller passes through the shift register 1804 of the PFER's Falling Edge Controller 1404 to be input to the shift registers 1804 of the FERs 1402 of one or more board groups 2504-2506 via JTAG buses 2508-2510. Also during the falling edge scan operation, TDO data from the shift register 1804 of the currently enabled FER 1402 of a board group 2504-2506 is input to the Routing Circuit 1502 of the PFER 2512 and output to the JTAG controller 106 via the TDO signal of bus 608. The TDI data input to the PFER's shift register 1804 contains address information to enable the PFER, as described in FIGS. 17-20, and select information to select one or more of the JTAG buses 2508-2510 as described in FIGS. 18-21. The TDI data input to the shift register 1804 of the FERs 1402 contains address information to enable one of the FERs, as described in FIGS. 17-20, and select information to select one or more of the JTAG device strings 606 coupled to the enabled FER as described in FIGS. 18-21. Simply put, the PFER 2512 is a circuit that lies in series between the JTAG controller 106 and the FERs 1402 of the board groups 2504-2506 that responds to falling edge scan operations to access one or more of the board groups 2504-2506 via JTAG buses 2508-2510. The Routing Circuit 1502 of the PFER can serially concatenate board group busses 2508-2510 together to allow board groups to be accessed simultaneously, as described in the Routing Circuit 1502 description of FIGS. 21 and 22.

Figure 27:
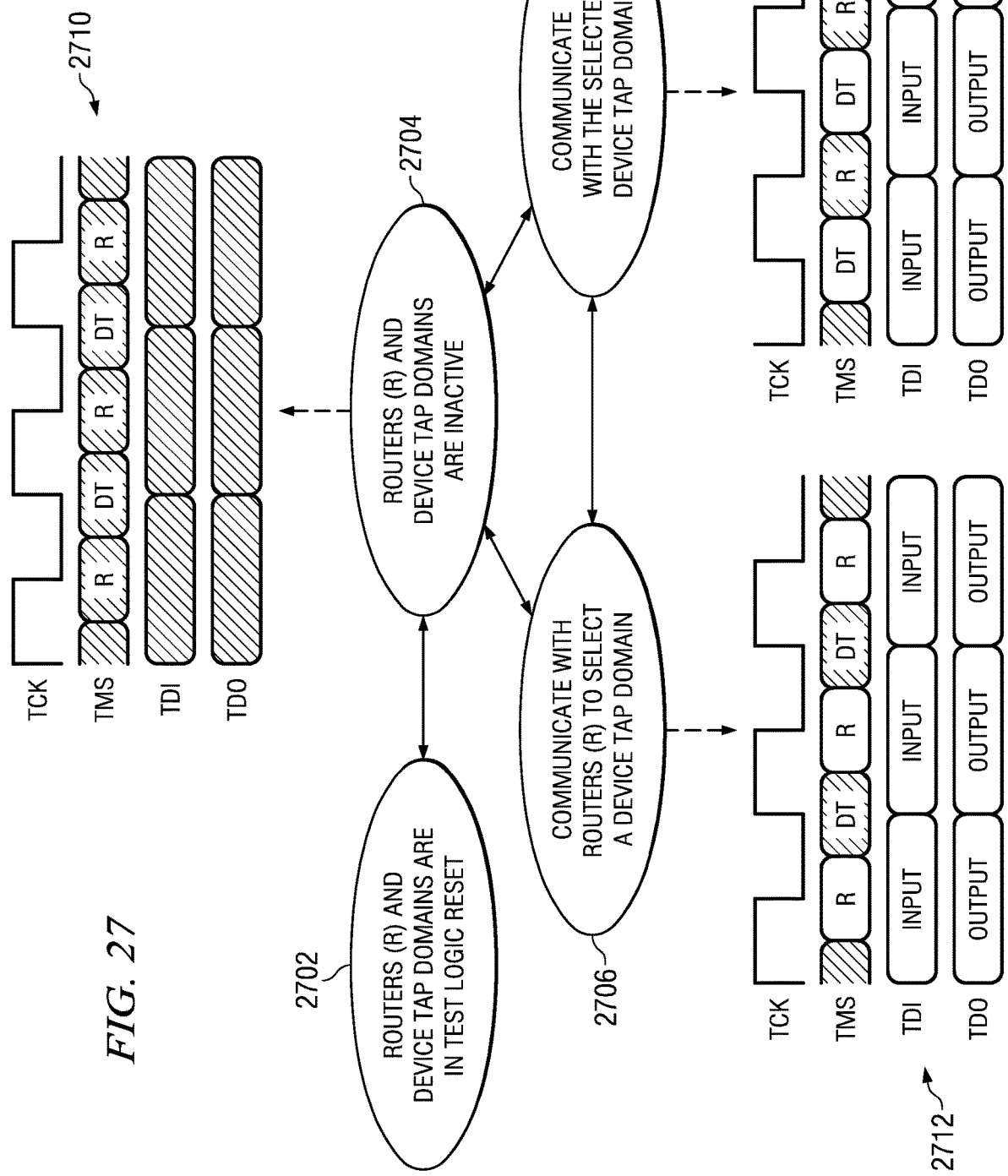
FIG. 27 illustrates one preferred, but not limited to, example of the operational states and timing of the Routers and TAP domains of FIG. 25 according to the disclosure.

FIG. 27 is provided to illustrate the operational states and timing of the Routers (R) (i.e. PFER 2512 and FER 1402) and the device TAPs (DT) 202 in device string domains 606 of FIG. 25. The operational states consist of; (1) a state 2702 where both the Routers (1402 and 2512) and DTs 202 are in a reset state (DTs in the Test Logic Reset state of FIG. 4 and the Routers in the Reset state of FIG. 20) in response to the TRST signal or logic values input on TMS, (2) a state 2704 where both the Routers and the DTs 202 are in an idle state (DTs in the Run Test/Idle, Pause-DR or Pause-IR state of FIG. 4 and the Routers in the Idle state of FIG. 20) in response to logic values input on TMS, (3) a state 2706 where communication occurs to the Routers while the DTs are idle in response to logic values input on TMS, and (4) a state 2708 where communication occurs to the DTs 202 while the Routers are idle in response to logic values input on TMS.

Timing diagram 2710 illustrates that logic values input on TMS, indicated by darkened time slots, during the rising and falling edges of TCK in state 2704 maintain the Routers and DTs 202 in the idle state 2704. In the idle state 2704, no data input or data output occurs on TDI and TDO respectively, also indicated by darkened fill in timing diagram 2710.

Timing diagram 2712 illustrates that values input on TMS (not darkened) during the falling edge of TCK in state 2706 enables the PFER 2512 to input data from a JTAG controller 106 and pass the data on to the TDI inputs of the FERs 1402, while TDO data from the currently enabled FER 1402 is input to the TDO input of the PFER 2512 to be passed on to the TDO input of the JTAG controller 106. During this falling edge scan operation, idle values are input on TMS (darkened) during the rising edge of TCK to maintain the DTs 202 in an idle state.

Timing diagram 2714 illustrates that values input on TMS (not darkened) during the rising edge of TCK in state 2708 enables the selected string 606 of one or more DTs 202 to input TDI data from a JTAG controller 106 via the PFER 2512 and FER 1402 and to output TDO data to the JTAG controller via the FER 1402 and PFER 2512. During this rising edge DT 202 string scan operation, idle values are input on TMS (darkened) during the falling edge of TCK to maintain the Routers (PFER and FER) in an idle state.

Figure 28:
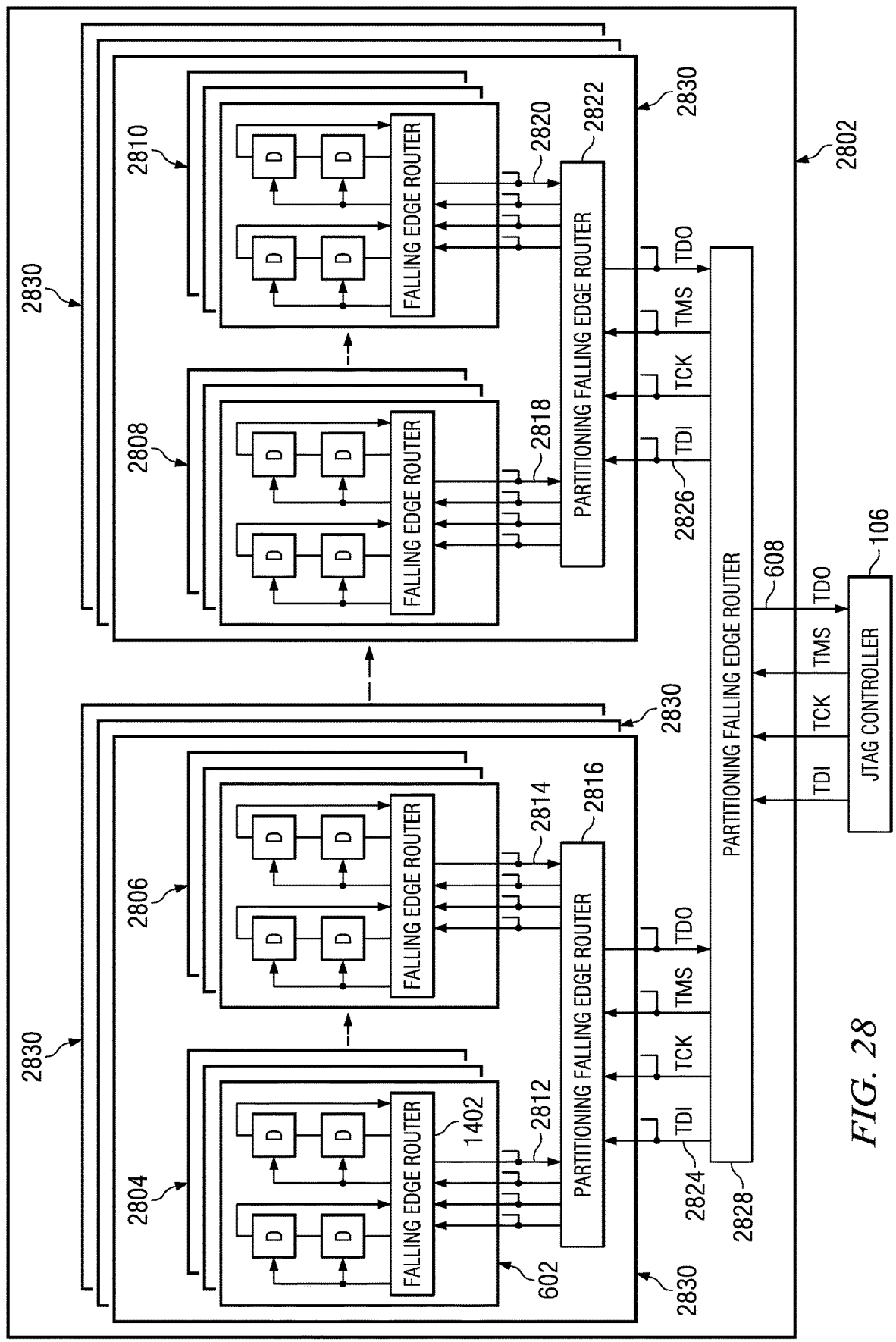
FIG. 28 illustrates a system comprising groups of one or more Falling Edge Router equipped sub-systems coupled to a JTAG controller via a hierarchy of Partitioning Falling Edge Routers according to the disclosure.

FIG. 28 illustrates a system 2802 comprising FER 1402 equipped boards 602 in separate board groups 2804-2810. The FERs 1402 of board group 2804 are coupled to a first selectable JTAG bus 2812 of a first PFER 2816 and the FERs of board group 2806 are coupled to a second selectable JTAG bus 2814 of the first PFER 2816. The FERs 1402 of board group 2808 are coupled to a first selectable JTAG bus 2818 of a second PFER 2822 and the FERs of board group 2810 are coupled to a second selectable JTAG bus 2820 of the second PFER 2822. The JTAG bus of the first PFER 2816 is coupled to a first selectable JTAG bus 2824 of a third PFER 2828 and the JTAG bus of the second PFER 2822 is coupled to a second selectable JTAG bus 2826 of the third PFER 2828. The JTAG bus of the third PFER 2828 is coupled to a JTAG controller 106 via JTAG bus 608.

Access to a device string 606 of a board 602 in board group 2804 is achieved by the JTAG controller 106 performing a falling edge scan operation, as previously described, to shift address and selection information into the shift register 1804 of the third PFER 2828, the shift register 1804 of the first PFER 2816 and the shift registers 1804 of the FERs 1402 of board group 2804. The FER 1402 having an address that matches the address shifted into its shift register 1804 is enabled to allow the JTAG controller 106 to access the selected device string 606 of the selected board 602 in the selected board group 2804 via the third PFER 2828, the first PFER 2816, and the enabled FER 1402, using rising edge JTAG scan operations.

Access to a device string 606 of a board 602 in board group 2806 is achieved by the JTAG controller 106 performing a falling edge scan operation, as previously described, to shift address and selection information into the shift register 1804 of the third PFER 2828, the shift register 1804 of the first PFER 2816 and the shift registers 1804 of the FERs 1402 of board group 2806. The FER 1402 having an address that matches the address shifted into its shift register 1804 is enabled to allow the JTAG controller 106 to access the selected device string 606 of the selected board 602 in the selected board group 2806 via the third PFER 2828, the first PFER 2816 and the enabled FER 1402, using rising edge JTAG scan operations.

Access to a device string 606 of a board 602 in board group 2808 is achieved by the JTAG controller 106 performing a falling edge scan operation, as previously described, to shift address and selection information into the shift register 1804 of the third PFER 2828, the shift register 1804 of the second PFER 2822 and the shift registers 1804 of the FERs 1402 of board group 2808. The FER 1402 having an address that matches the address shifted into its shift register 1804 is enabled to allow the JTAG controller 106 to access the selected device string 606 of the selected board 602 in the selected board group 2808 via the third PFER 2828, the second PFER 2822, and the enabled FER 1402, using rising edge JTAG scan operations.

Access to a device string 606 of a board 602 in board group 2810 is achieved by the JTAG controller 106 performing a falling edge scan operation, as previously described, to shift address and selection information into the shift register 1804 of the third PFER 2828, the shift register 1804 of the second PFER 2822 and the shift registers 1804 of the FERs 1402 of board group 2810. The FER 1402 having an address that matches the address shifted into its shift register 1804 is enabled to allow the JTAG controller 106 to access the selected device string 606 of the selected board 602 in the selected board group 2810 via the third PFER 2828, the second PFER 2822, and the enabled FER 1402, using rising edge JTAG scan operations.

As seen in FIG. 28, there can be multiple arrangements 2830 of board groups 2804-2806 coupled to a PFER 2816 and board groups 2808-2810 coupled to a PFER 2822. The PFER of each arrangement 2830 can be uniquely addressed using falling edge scan operations to allow the JTAG controller 106 to access a selected device string 606 of a selected FER 1402 using rising edge JTAG scan operations as described above.

Also as seen in FIG. 28, PFERs can be arranged in a hierarchical fashion which extends the access of a JTAG controller 106 to device strings 606 of remotely positioned boards 602.

Figure 29:
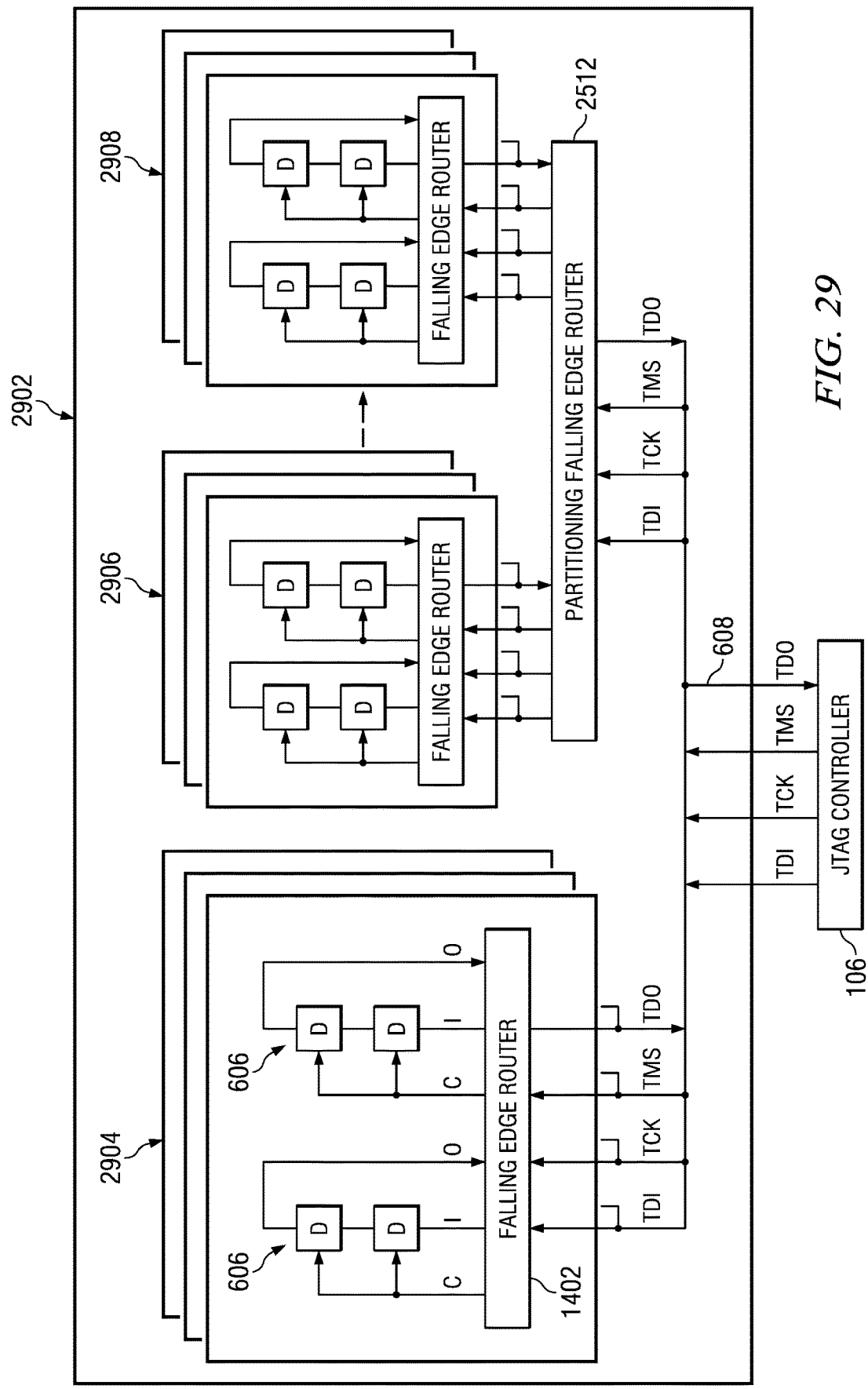
FIG. 29 illustrates a system comprising groups of one or more Falling Edge Router equipped sub-systems coupled to a JTAG controller either directly or via an intervening Partitioning Falling Edge Router according to the disclosure.

FIG. 29 illustrates a system 2902 comprising FER 1402 equipped boards in separate board groups 2904, 2906 and 2908. The FERs 1402 of board group 2904 are coupled directly to a JTAG controller 106 via bus 608. The FERs of board groups 2906 and 2908 are coupled to the JTAG controller 106 via a PFER 2512 as previously described. In this arrangement the JTAG controller 106 can perform a falling edge scan operation to directly access a board in board group 2904, or to access a board in one or both of board groups 2906-2908 via the PFER 2512. As seen, FERs 1402 and PFER 2512 can compatibly exist on the same bus 608 to a JTAG controller 106.

Figure 30:
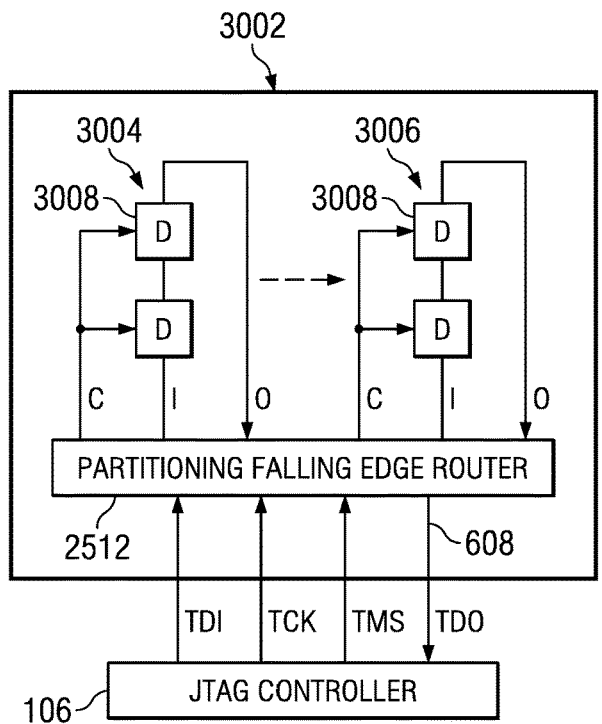
FIG. 30 illustrates a system comprising strings of one or more devices each containing Rising and Falling Edge Circuitry coupled to a JTAG controller via a Partitioning Falling Edge Router according to the disclosure.
Figure 31:
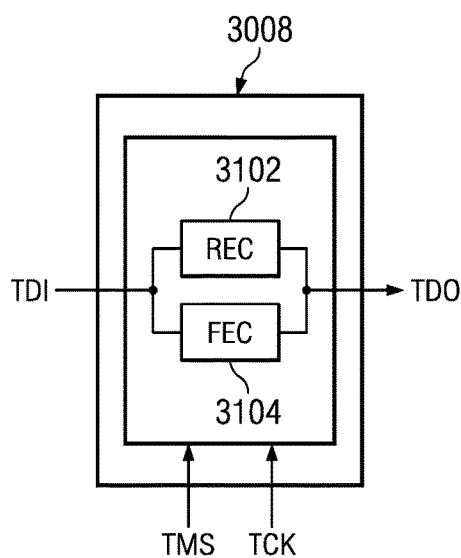
FIG. 31 illustrates an example of a device containing Rising and Falling Edge Circuitry according to the disclosure.

FIG. 30 illustrates a system 3002 comprising strings 3004 and 3006 of one or more devices 3008 coupled to a PFER 2512. The PFER is coupled to a JTAG controller 106 via bus 608. The devices 3008, as shown in FIG. 31, are designed to include both rising edge circuitry (REC) 3102 and falling edge circuitry (FEC) 3104 coupled to the devices TDI, TCK, TMS and TDO signal leads. The rising edge circuitry 3102 includes the JTAG TAP 202 and optionally other types of circuitry. During rising edge TCK scan operations, the rising edge circuitry 3102 inputs data from TDI and outputs data on TDO. During falling edge TCK scan operations, the falling edge circuitry 3104 inputs data from TDI and outputs data on TDO. Examples of devices 3008 that include both rising and falling edge circuitry are described in pending patent disclosures TI-66079, TI-66140 and TI-68392 all incorporated herein by reference.

It should be understood that the system 3002 of FIG. 30 could be; (1) a board containing multiple strings of rising and falling edge operated IC devices 3008 coupled to a PFER 2512, (2) an IC containing multiple rising and falling edge operated embedded core circuit devices 3008 coupled to a PFER 2512, or (3) a core circuit containing multiple rising and falling edge operated further core circuit devices 3008 coupled to a PFER 2512. This will be the case for other similar figures in this disclosure.

Figure 32:
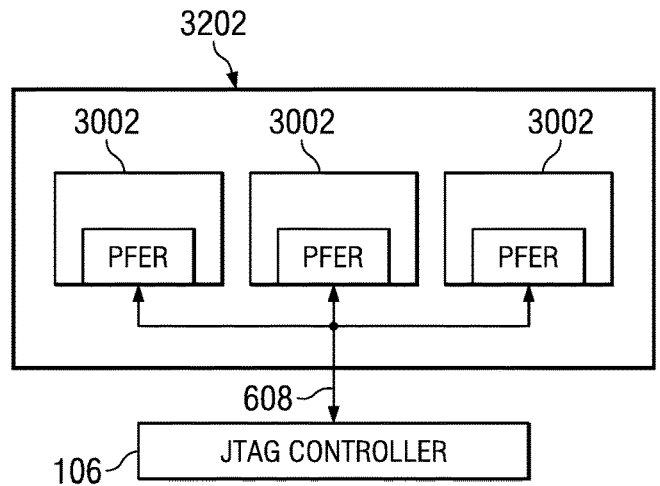
FIG. 32 illustrates a system comprising multiple FIG. 30 systems coupled to a JTAG controller according to the disclosure.

FIG. 32 illustrates a larger system 3202 comprising multiple systems 3002, each system 3002 having a PFER 2512 coupled to a JTAG controller 106 via bus 608. The JTAG controller 106 can access any one of the system 3002 device strings 3004-3006 via the system's 3002 PFER 2512. The JTAG controller 106 can also access a series of concatenated device strings 3004-3006 of a selected system 3002 via the system's PFER 2512.

Figure 33:
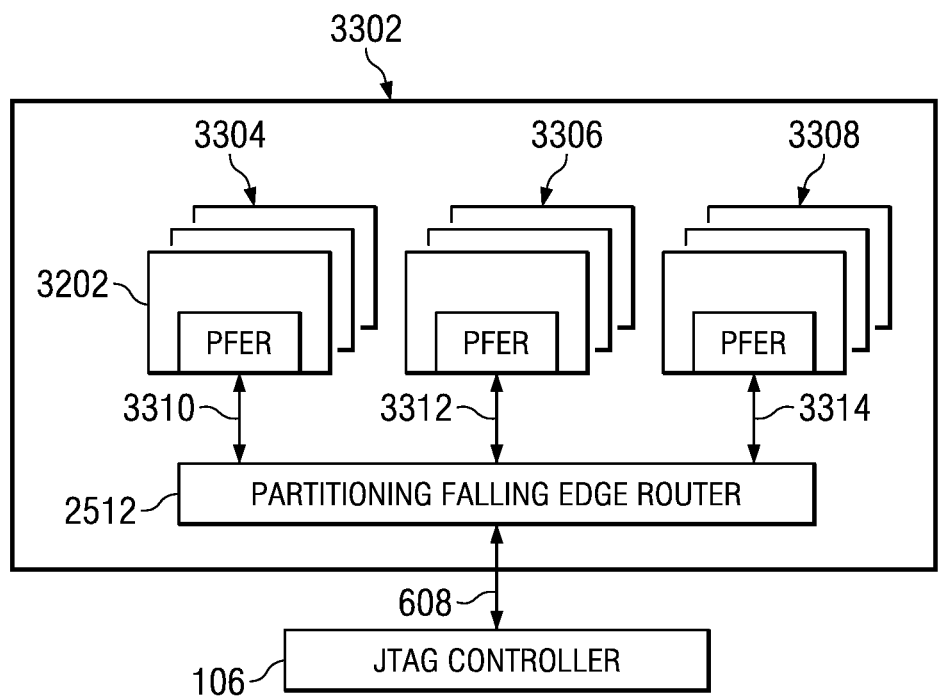
FIG. 33 illustrates a system comprising multiple groups of FIG. 30 systems coupled to a JTAG controller via a Partitioning Falling Edge Controller according to the disclosure.

FIG. 33 illustrates a further larger system 3302 comprising separate groups 3304-3308 of larger systems 3202, each separate group 3304-3308 of larger systems 3202 being coupled to a PFER 2512 via separate busses 3310-3314. The PFER 2512 of the further larger system 3302 is coupled to a JTAG controller 106 via bus 608. The JTAG controller 106 can access any one or more of the larger systems 3202 in the separate groups 3304-3308 by communicating with the PFER 2512 of further larger system 3302 using falling edge scan operations.

Figure 34:
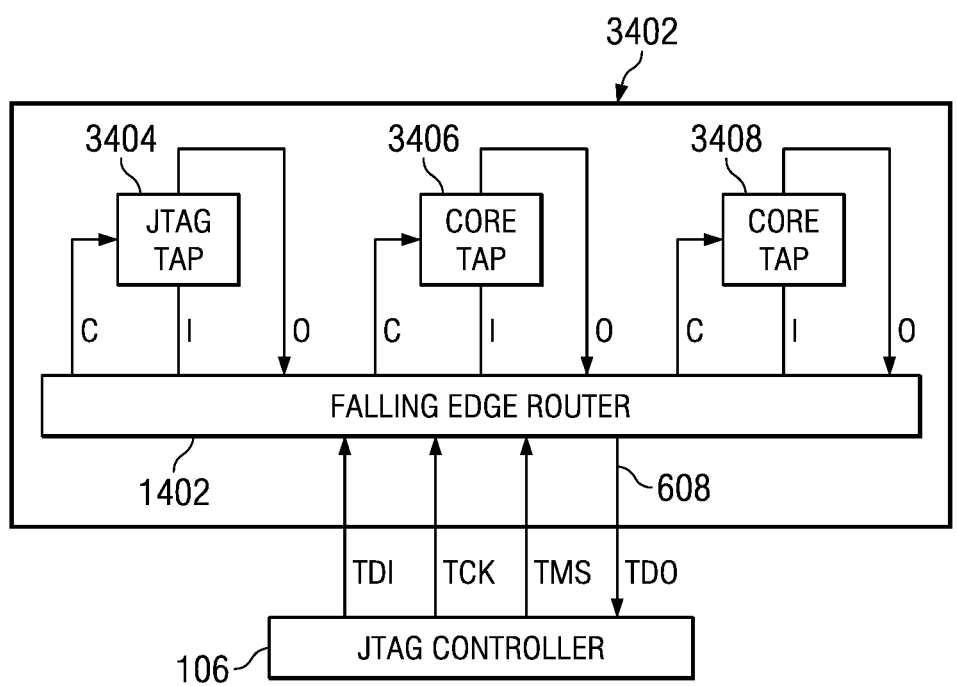
FIG. 34 illustrates a device comprising a JTAG TAP domain, a first core TAP domain, and a second core TAP domain coupled to a JTAG controller via a Falling Edge Router according to the disclosure.

FIG. 34 illustrates a device 3402, which in this example is an IC or an embedded core within an IC, comprising individually selectable TAP 202 circuit domains 3404-3408. TAP circuit domain 3404 is the JTAG boundary scan TAP 202 of the IC or core 3402, TAP circuit domain 3406 is a TAP 202 of a first core circuit within the IC or core 3402, and TAP circuit domain 3408 is a TAP of a second core circuit within the IC or core 3402. Each TAP 3404-3408 is coupled to a selectable JTAG bus of a FER 1402 via a control bus (C) consisting of a TMS and a TCK signal, an input bus (I) consisting of a TDI signal, and an output bus (O) consisting of a TDO signal. The FER 1402 is coupled to a JTAG controller 106 via a JTAG bus 608. In response to a falling edge scan operation, the FER 1402 can couple one of the TAP circuits 3404-3408 to the JTAG controller 106, as previously described, so it can be access by the JTAG controller during a rising edge JTAG scan operation. The JTAG boundary scan TAP 3404 is accessed to perform JTAG test operations on the device 3402. The Core TAP 3406 is accessed to perform test, debug, and/or emulation operations on the associated core of the device 3402. Core TAP 3408 is accessed to perform test, debug and/or emulation operations on the associated core 3408 of the device 3402. As previously described, the FER 1402 may serially concatenate multiple TAP circuit domains 3404-3408 together so that they can simultaneously perform an operation during a rising edge JTAG scan operation.

Figure 35:
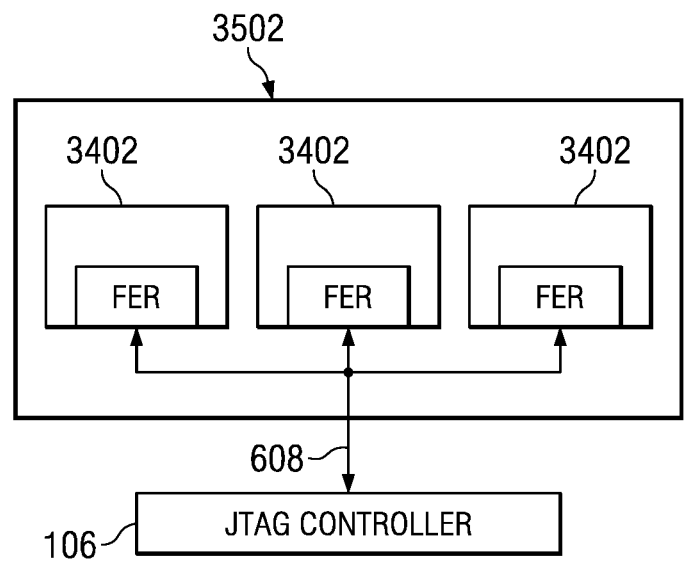
FIG. 35 illustrates a system comprising multiple FIG. 34 devices coupled to a JTAG controller according to the disclosure.

FIG. 35 illustrates a system 3502, which could be a board, an IC, or a core circuit within an IC, comprising multiple FER 1402 equipped devices 3402. The JTAG bus of each FER 1402 of each device 3402 are connected together (TDI to TDI, TMS to TMS, TCK to TCK, and TDO to TDO) and to a JTAG controller 106 via bus 608. The JTAG controller 106 can access any one of the TAPs 3404-3406 in any one device 3402 via the device's FER. The JTAG controller 106 can also access any serial combination of TAPs 3404-3408 in a device 3402 via the device's FER.

Figure 36:
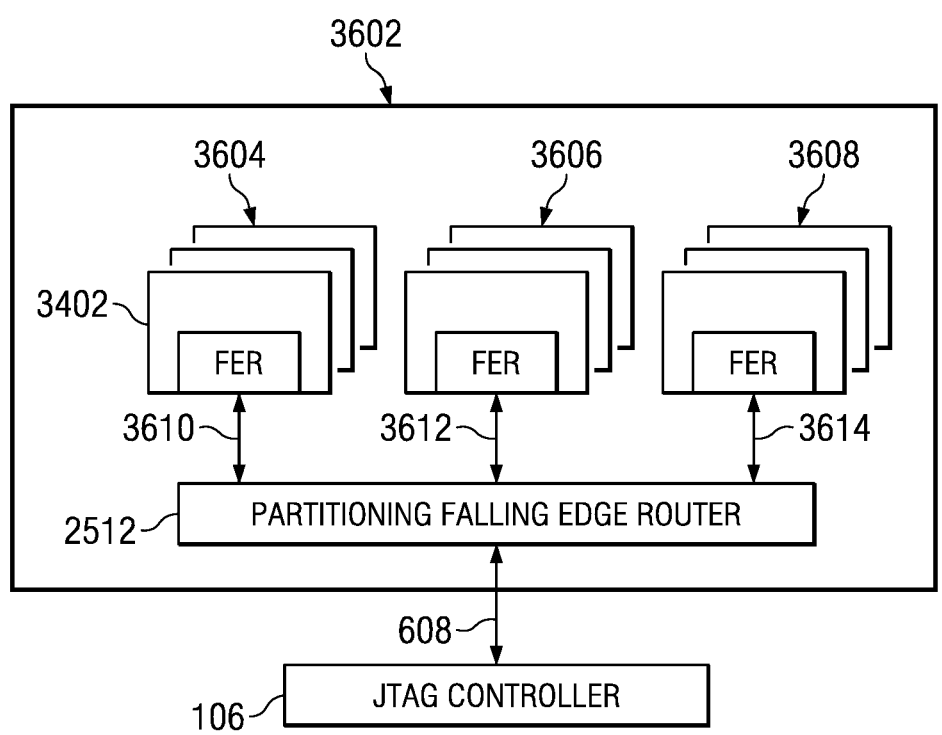
FIG. 36 illustrates a system comprising multiple groups of FIG. 34 devices coupled to a JTAG controller via a Partitioning Falling Edge Router according to the disclosure.

FIG. 36 illustrates a system 3602, which could be a board, an IC, or a core circuit within an IC, comprising separate groups 3604-3608 of devices 3402, each separate group 3604-3608 of devices 3402 being coupled to a PFER 2512 via separate busses 3610-3614. The PFER 2512 of the system 3602 is coupled to a JTAG controller 106 via bus 608. The JTAG controller 106 can access any one or more of the devices 3402 in the separate groups 3604-3608 by communicating with the PFER 2512 of the system 3602 and the FER 1402 of the devices using falling edge scan operations as previously described.

Figure 37:
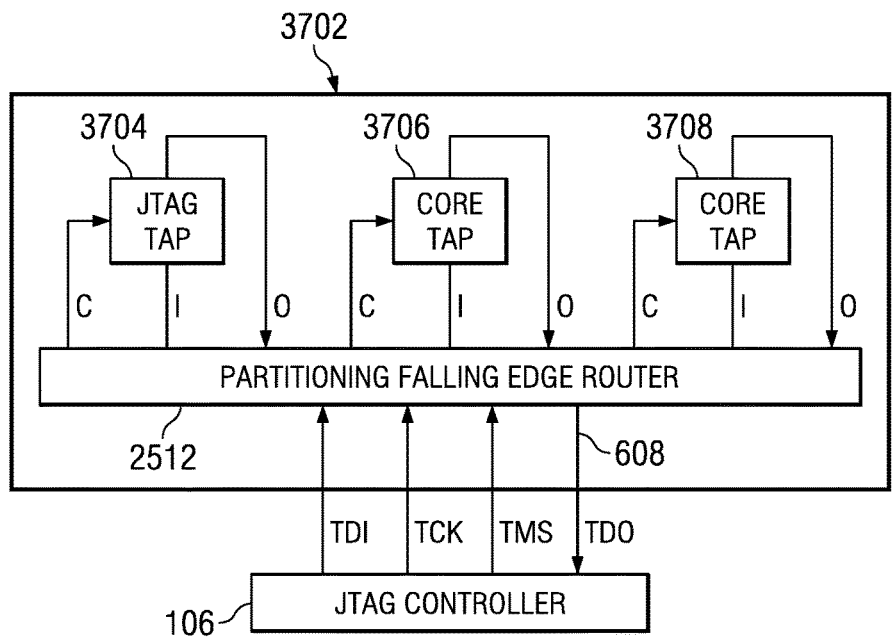
FIG. 37 illustrates a device comprising a JTAG TAP domain, a first core TAP domain, and a second core TAP domain coupled to a JTAG controller via a Partitioning Falling Edge Router according to the disclosure.
Figure 38:
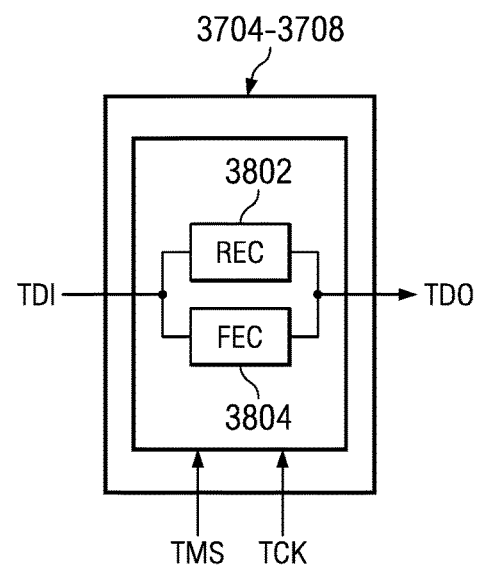
FIG. 38 illustrates an example of a modified TAP circuit domain containing Rising and Falling Edge Circuitry according to the disclosure.

FIG. 37 illustrates a device 3702, which in this example is an IC or an embedded core within an IC, comprising individually selectable modified TAP circuit domains 3704-3708. The modified TAP circuit domains 3704-3708, as shown in FIG. 38, are designed to include both rising edge circuitry (REC) 3802 and falling edge circuitry (FEC) 3804 coupled to the devices TDI, TCK, TMS and TDO signal leads. The rising edge circuitry 3802 includes the JTAG TAP 202 and optionally other types of circuitry. During rising edge TCK scan operations, the rising edge circuitry 3802 inputs data from TDI and outputs data on TDO. During falling edge TCK scan operations, the falling edge circuitry 3804 inputs data from TDI and outputs data on TDO. Examples of modified TAP circuit domains 3704-3708 that include both rising and falling edge circuitry are described in aforementioned pending patent disclosures TI-66079, TI-66140 and TI-68392.

Modified TAP circuit domain 3704 operates as a JTAG TAP 202 to perform JTAG boundary scan test operations in device 3702 during rising edge scan operations and operates as another circuit to perform other operations during falling edge scan operations. Modified TAP circuit domain 3706 operates as a JTAG TAP 202 to perform test, debug and/or emulation operations on the associated core during rising edge scan operations and operates as another circuit to perform other types of operations on the associated core during falling edge scan operations. Modified TAP circuit domain 3708 operates as a JTAG TAP 202 to perform test, debug and/or emulation operations on the associated core during rising edge scan operations and operates as another circuit to perform other types of operations on the associated core during falling edge scan operations.

Each modified TAP domain 3704-3708 is coupled to a separate JTAG bus of a PFER 2512 via a control bus (C) consisting of a TMS and a TCK signal, an input bus (I) consisting of a TDI signal, and an output bus (O) consisting of a TDO signal. The PFER 2512 is coupled to a JTAG controller 106 via a JTAG bus 608. During falling edge scan operations, TDI data from the JTAG controller 106 is communicated through the shift register 1804 of the PFER 2512 and into to the falling edge circuitry 3804 of a selected modified TAP domain 3704-3708, while TDO data from the selected modified TAP domain is communicated through the Routing Circuit 1502 of the PFER 2512 to the TDO input of the JTAG controller 106. During rising edge scan operations, TDI data from the JTAG controller 106 is communicated through the Routing Circuit 1502 of the PFER 2512 and into to the rising edge circuitry 3802 of a selected modified TAP domain 3704-3708, while TDO data from the selected modified TAP domain 3704-3708 is communicated through the Routing Circuit 1502 of the PFER 2512 to the TDO input of the JTAG controller 106. As previously described, the Routing Circuit 1502 of the PFER 2512 can serial concatenate multiple modified TAP domains 3704-3708 together to allow the multiple modified TAP domains 3704-3708 to operate simultaneously during either a rising edge scan operation or a falling edge scan operation.

Figure 39:
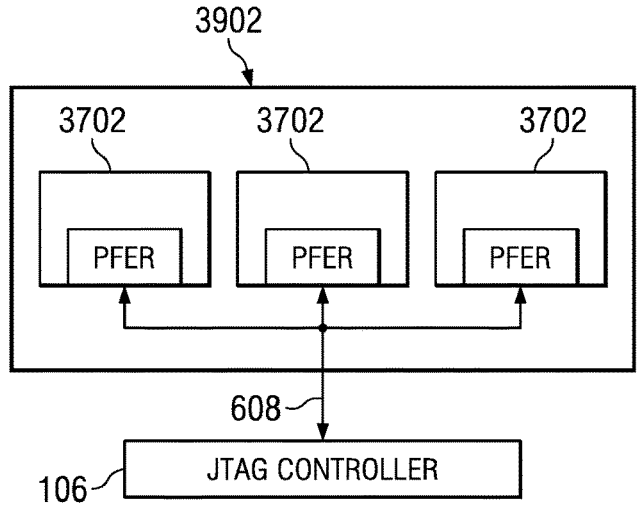
FIG. 39 illustrates a system comprising multiple FIG. 37 devices coupled to a JTAG controller according to the disclosure.

FIG. 39 illustrates a system 3902, which could be a board, an IC, or a core circuit within an IC, comprising multiple PFER 2512 equipped devices 3702. The JTAG bus of each PFER 2512 of each device 3702 are connected together (TDI to TDI, TMS to TMS, TCK to TCK, and TDO to TDO) and to a JTAG controller 106 via bus 608. The JTAG controller 106 can access any one of the modified TAP domains 3704-3706 in any one device 3702 via the device's PFER. The JTAG controller 106 can also access any serial combination of modified TAP domains 3704-3708 in a device 3702 via the device's PFER.

Figure 40:
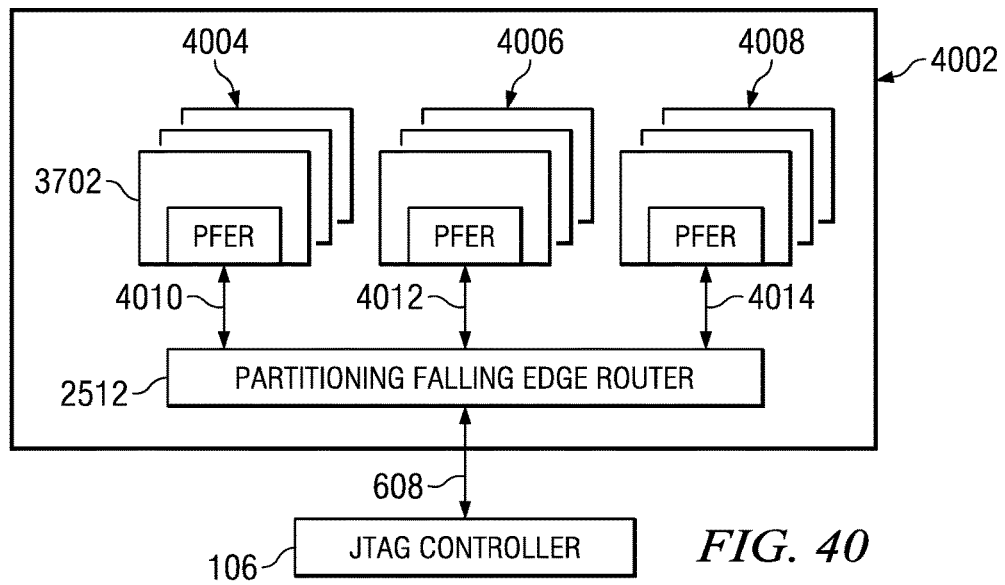
FIG. 40 illustrates a system comprising multiple groups of FIG. 37 devices coupled to a JTAG controller via a Partitioning Falling Edge Router according to the disclosure.

FIG. 40 illustrates a system 4002, which could be a board, an IC, or a core circuit within an IC, comprising separate groups 4004-4008 of devices 3702, each separate group 4004-4008 of devices 3702 being coupled to a PFER 2512 via separate busses 4010-4014. The PFER 2512 of the system 4002 is coupled to a JTAG controller 106 via bus 608. The JTAG controller 106 can access any one or more of the devices 3702 in the separate groups 4004-4008 by communicating with the PFER 2512 of system and the PFER 2512 of the devices 3702 using rising and falling edge scan operations as previously described.

Figure 41:
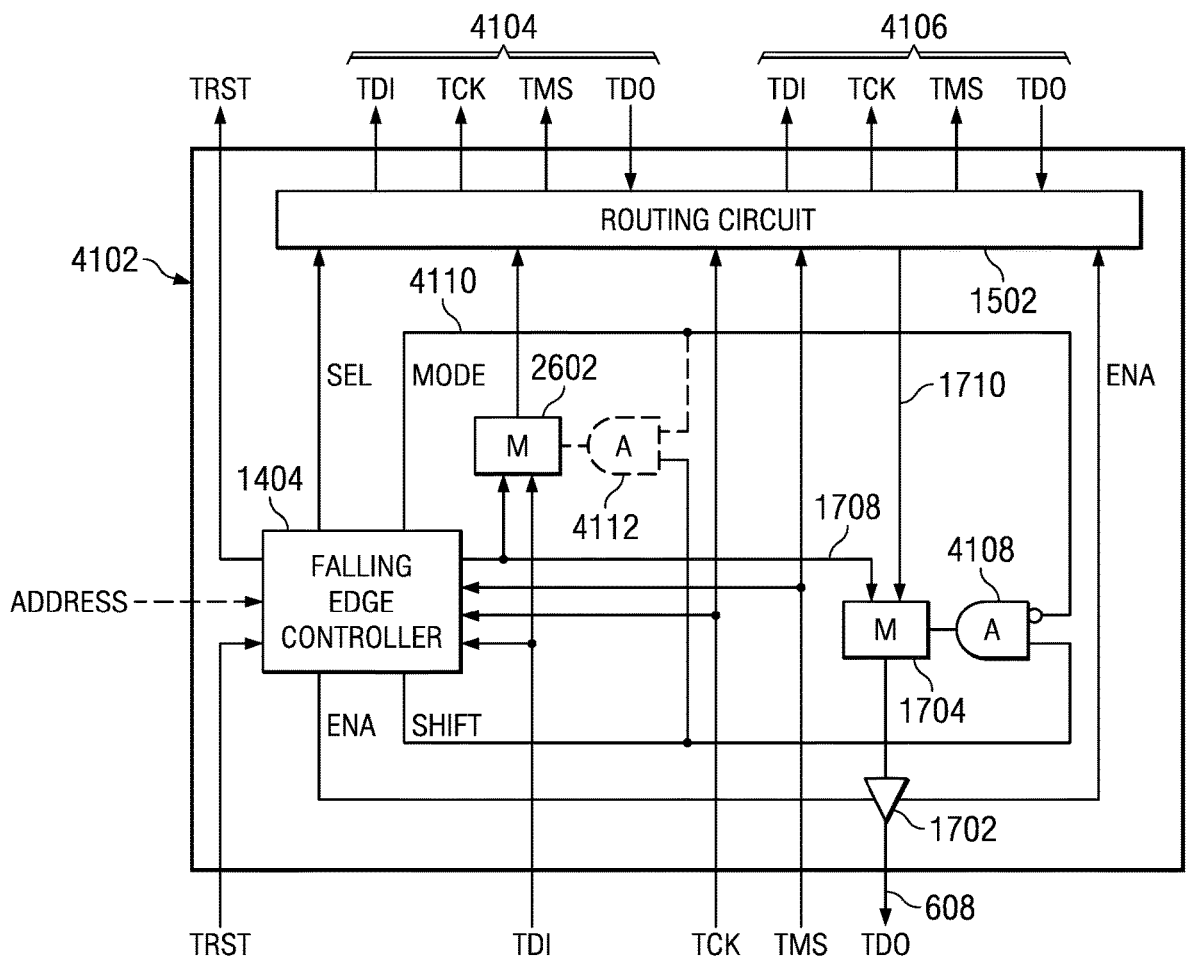
FIG. 41 illustrates a view of a Configurable Falling Edge Router according to the disclosure.

FIG. 41 illustrates an example implementation of a Configurable Falling Edge Router (CFER) 4102 that is programmable, via a Mode signal, to operate as either the FER 1402 or the PFER 2512. The CFER 4102 has a modified Falling Edge Controller 1404, a Routing Circuit 1502, multiplexer 2602, multiplexer 1704, And gate 4108, And gate 4112 and TDO output buffer 1702. The Falling Edge Controller 1404 of FIG. 18 is modified in FIG. 41 to include a Mode output signal 4110. The Mode output signal 4110 controls whether the CFER 4102 operates as a FER 1404 or a PFER 2512.

Figure 42:
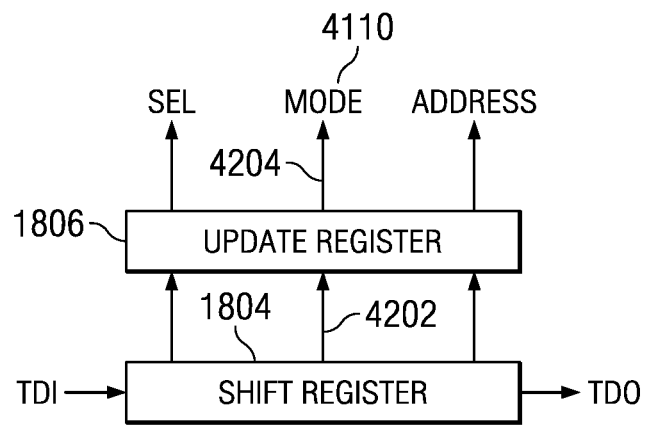
FIG. 42 illustrates the shift and update registers of the Falling Edge Controller of FIG. 41 according to the disclosure.

FIG. 42 illustrates an example modification of the Falling Edge Controller 1404. The modification is simply to extend the shift register 1804 of the Falling Edge Controller 1404 to include a bit position 4202 for inputting the Mode signal 4110 and to extend the update register 1806 of the Falling Edge Controller to include a bit position 4204 for outputting the Mode signal 4110.

When the Mode signal 4110 is set low, the Shift signal from the Falling Edge Controller 1404 passes through And gate 4108 during falling edge scan operations (i.e. during the Shift state of FIG. 20) to allow the data TDO signal 1708 from Shift register 1804 to be output on TDO of bus 608, via multiplexer 1704. Also when the Mode signal 4110 is set low, And gate 4112 forces multiplexer 2602 to pass the TDI signal of bus 608 to the Routing Circuit 1502. In this configuration, the CFER 4102 operates identical to the FER 1402 of FIG. 17.

When the Mode signal 4110 is set high, And gate 4108 forces the multiplexer 1704 to output the TDO data 1710 from the Routing Circuit 1502 to the TDO of bus 608 during falling edge scan operations. Also when the Mode signal 4110 is set high, the Shift signal from the Falling Edge Controller 1404 passes through And gate 4112 during falling edge scan operations (i.e. during the Shift state of FIG. 20) to allow the data TDO signal 1708 from Shift register 1804 to be input to the Routing Circuit 1502, via multiplexer 2602. In this configuration, the CFER 4102 operates identical to the PFER 2512 of FIG. 26.

As seen in dotted line, And gate 4112 may be removed from the CFER 4102 to allow the Shift signal from the Falling Edge Controller 1404 to be directly connected to the control input of multiplexer 2602. While this changes the operation of the CFER 4102 from being identical to the FER 1402, since the data TDO signal 1708 from Shift register 1804 during the Shift state of FIG. 20 is input to the Routing Circuit instead of the TDO data of bus 608, it does not affect the ability of the CFER 4102 to operate as a FER 1402.

Figure 43:
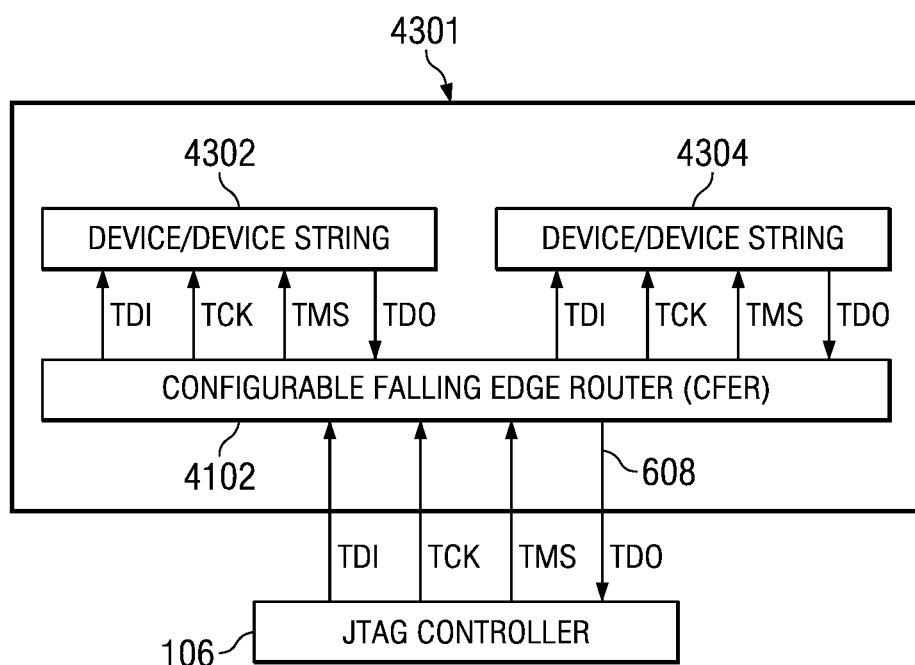
FIG. 43 illustrates a system comprising multiple devices or device strings coupled to a JTAG controller via the Configurable Falling Edge Router of FIG. 41 according to the disclosure.

FIG. 43 illustrates a system 4301 with a CFER 4102 operating as a FER 1402 to interface a JTAG controller 106 to a first device or device string 4302 and a second device or device string 4304. The Mode signal 4110 of the CFER 4102 is set low to enable this operation mode. Preferably, but not necessarily, according to the disclosure, the Mode signal 4110 is set low in response to a TRST signal input to the update register 1806, to allow the CFER 4102 to be immediately configured as a FER 1402 in response to the TRST signal. The TRST signal input to the update register 1806 may occur in response to an external TRST input of FIG. 18, entry into the Reset state of FIG. 20, or by a power up reset circuit associated with CFER 4102. The advantage of having the Mode signal 4110 initially set low is that the CFER 4102 is immediately available for use as a FER 1402 to allow a JTAG controller 106 to access a device or device string 4302-4304. The system 4301 may be a board, an IC or an embedded core circuit within an IC.

Figure 44:
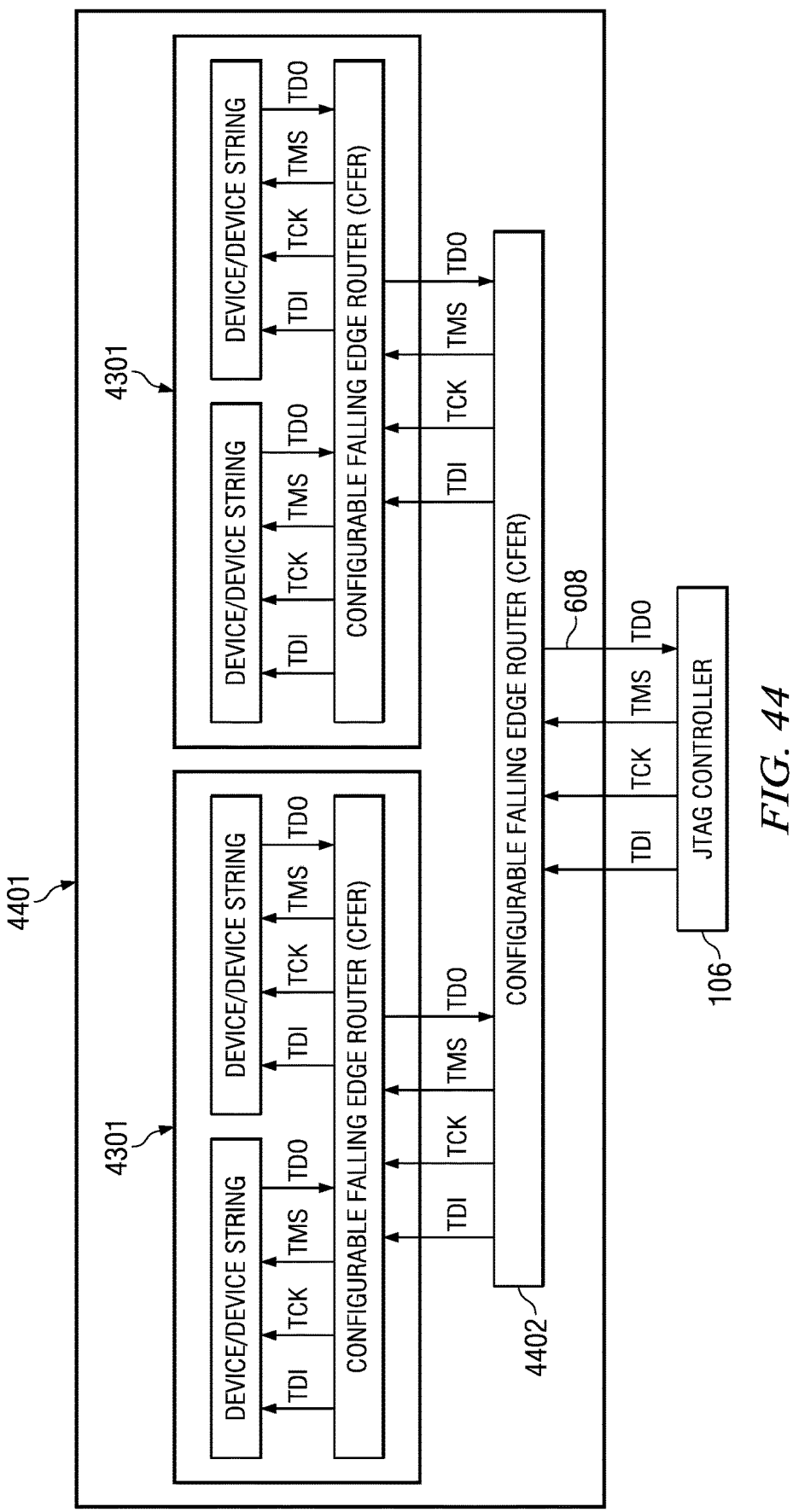
FIG. 44 illustrates a further system comprising multiple FIG. 43 systems coupled to a JTAG controller via the Configurable Falling Edge Router of FIG. 41 according to the disclosure.

FIG. 44 illustrates a further system 4401 with a CFER 4402 interfacing a JTAG controller 106, to multiple systems 4301 of FIG. 43. The Mode signal of CFER 4402 is set high to enable it to operate as a PFER 2512, and the Mode signals of the CFERS in systems 4301 are set low to enable them to operate as FERs 1402. If the Mode signal 4110 of CFER 4402 is initially set low after a TRST signal input as described in FIG. 43, an initial falling edge scan operation to the CFER 4402 from the JTAG controller 106 will be necessary to configure CFER 4402 to operate as a PFER 2512. The further system 4401 may be a board, an IC or an embedded core circuit within an IC.

As seen in FIGS. 43 and 44, the advantage of the CFER 4102 over a separate FER 1402 and PFER 2512 is that only one product, the CFER 4102, need be provided by a semiconductor manufacturer to support the functionality of both the FER 1402 and PFER 2512. Customers purchasing the CFER 4102 can selectively use the CFER 4102 in their systems as either a FER 1402 or PFER 2512.

Figure 45:
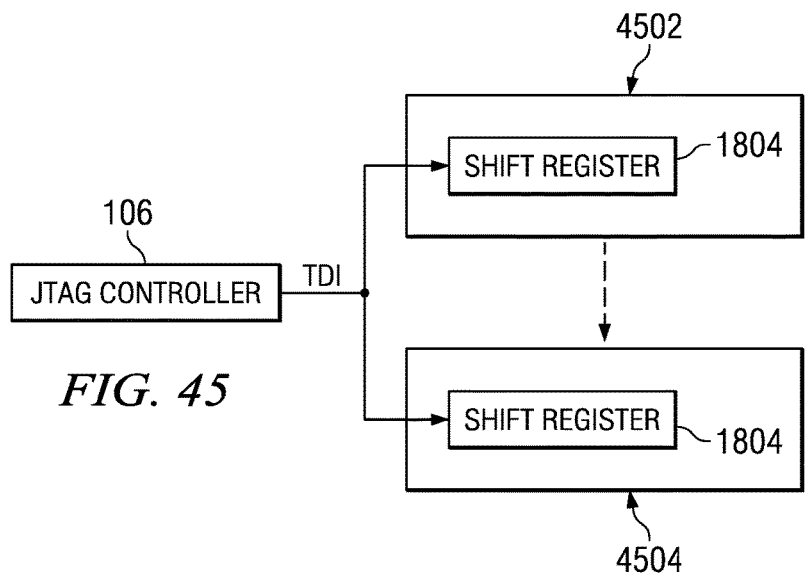
FIG. 45 illustrates equal length shift registers of multiple Falling Edge Routers coupled to the TDI signal output from a JTAG controller according to the disclosure.

FIG. 45 illustrates a JTAG controller 106 TDI connection to shift registers 1804 in FERs 4502-4504, which can be FERs 1402 or CFERs 4102. The purpose of this illustration is to show the advantage of using equal length shift registers 1804 in FERs 4502-4504. Assuming the shift registers 1804 are designed to have the same fixed number of bits, the JTAG controller 106 simply inputs the fixed number of bits to the shift registers 1804 via TDI during the Shift state of FIG. 20 to enable one of the FERs 4502-4504 and select a device 104 or device string 606 coupled to the enabled FER 4502-4504. If the shift registers 1804 had different bit lengths the JTAG controller would have to shift in a different number of bits each time a different FER is to be enabled for accessing a device 104 or device string 606, which complicates the JTAG controller software. Also if the shift registers 1804 had different bit lengths it opens up the possibility that two or more FERs 4502-4504 may accidently be addressed and enabled together. This would be due to a bit pattern shifted into a shift register 1804 of a desired FER 4502-4504 to be addressed and enabled having a subset bit pattern that also addresses and enables a non-desired FER 4502-4504.

Figure 46:
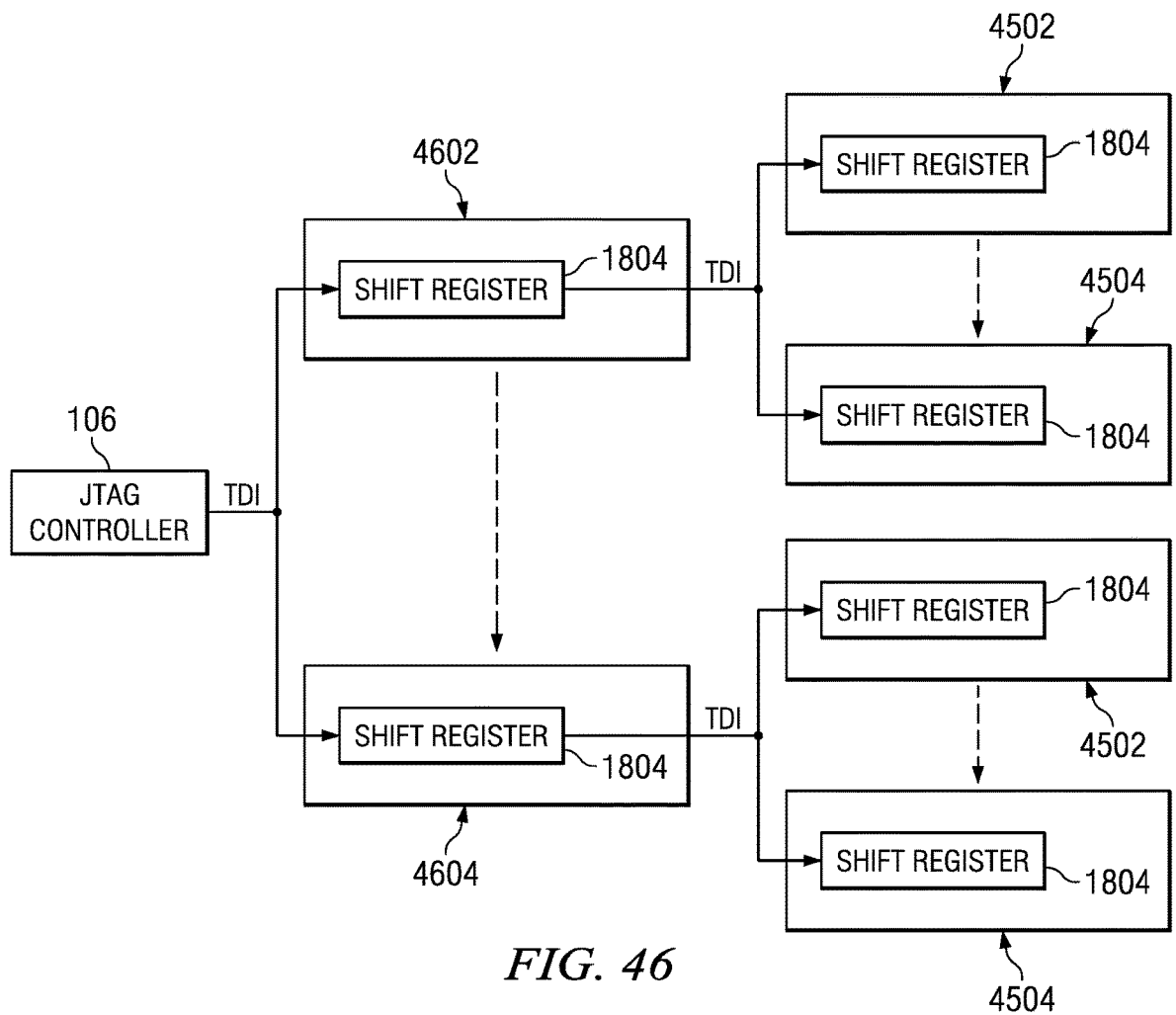
FIG. 46 illustrates equal length shift registers of multiple Partitioning Falling Edge Routers and multiple Falling Edge Routers coupled to the TDI signal output from a JTAG controller according to the disclosure.

FIG. 46 illustrates a JTAG controller 106 TDI connection to shift registers 1804 in PFERs 4602-4604, which can be PFERs 2512 or CFERs 4102. The PFERs 4602-4604 each pass the TDI data from the JTAG controller onto a group of connected FERs 4502-4504. The purpose of this illustration is to show the advantage of using equal length shift registers 1804 in both the PFERs 4602-4604 and FERs 4502-4504. Assuming the shift registers 1804 of both the PFERs 4602-4604 and FERs 4502-4504 are designed to have the same fixed number of bits, the JTAG controller 106 simply performs a scan operation containing the fixed number of bits for the shift registers 1804 in the PFERs and the fixed number of bits for the shift registers 1804 in the connected FERs to address and enable a selected PFER 4602-4604 and one or more of its connected FERs 4502-4504. If the shift registers 1804 of the PFERs 4602-4604 and FERs 4502-4504 had different bit lengths the JTAG controller would have to shift in a different number of bits each time a different PFER and FER combination is to be enabled for accessing a device 104 or device string 606, which complicates the JTAG controller software. Also if the shift registers 1804 of the PFER and FER had different bit lengths it opens up the possibility that two or more PFER and FER combinations may accidently be addressed and enabled together. This would be due to a bit pattern shifted into the shift registers 1804 of a desired PFER and FER combination to be addressed and enabled having a subset bit pattern that also addresses and enables a non-desired PFER and FER combination.

According to the disclosure, the shift registers 1804 of both the PFERs 4602-4604 and FERs 4502-4504 should preferably be fixed at the same length. However, the fixed shift register length of the PFERs 4602-4604 may be different from the fixed shift register length of the FERs 4502-4504 if desired without incurring the above mentioned problem.

While this disclosure has described use of a FER 1402, PFER 2512, or CFER 4102 that operates in response to the falling edge of TCK to access a rising edge TCK operated JTAG port on a device or device string, the disclosure is not limited to accessing only JTAG ports. In general, the router of this disclosure can be used to access any type of clocked device port by using the inactive edge of the ports clock, as described in following FIGS. 47 and 48.

Figure 47:
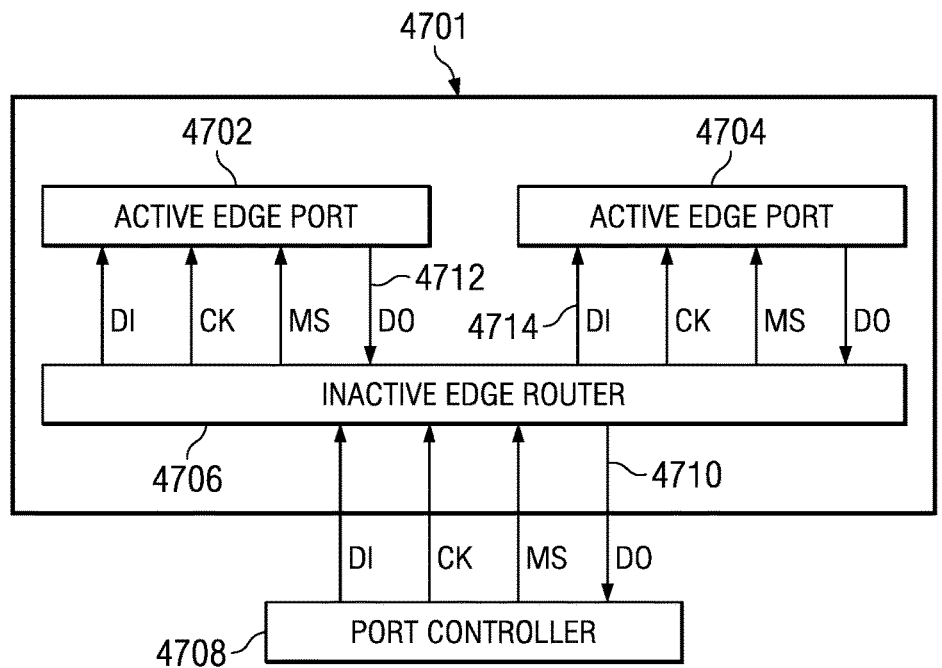
FIG. 47 illustrates a system comprising multiple Active Edge Ports coupled to a Port controller via an Inactive Edge Router according to the disclosure.
Figure 49A:
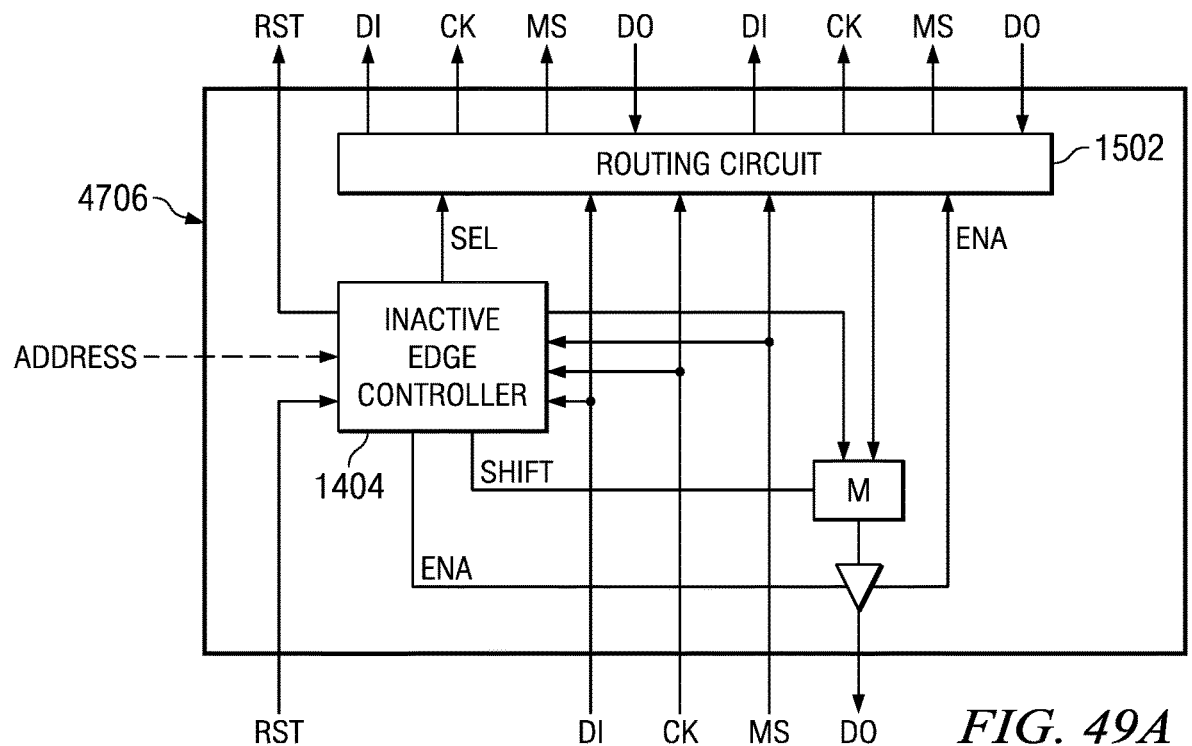
FIG. 49A illustrates an example implementation of an Inactive Edge Router according to the disclosure.

FIG. 47 illustrates a system 4701 comprising an Inactive Edge Router 4706 and Active Edge Ports 4702-4704. The Active Edge Ports 4702-4704 may be any type of input/output port that exists within the system 4701. The system 4701 may be a board, an IC, or an embedded core circuit within an IC. A Port Controller 4708, which may be any type of port controller, is coupled to the Inactive Edge Router 4706 via a bus 4710 comprising a data input (DI) signal in place of the TDI signal, a clock (CK) signal in place of the TCK signal, a mode select (MS) signal in place of the TMS signal, and a data output (DO) signal in place of the TDO signal. The Active Edge Ports 4702 and 4704 are coupled to the Inactive Edge Router 4706 via buses 4712 and 4714 respectively. Each bus 4712 and 4714 comprises a DI signal, a CK signal, a MS signal, and a DO signal. The words "Active Edge" indicates the CK edge the port uses to perform its input/output operation. The words "Inactive Edge" indicates the CK edge the Router 4706 uses to couple Active Edge Port 4702 and/or Active Edge Port 4704, via buses 4712 and 4714, to the Port Controller 4708 via bus 4710. If the "Active Edge" is the rising edge of the CK signal the "Inactive Edge" is the falling edge of the CK signal. If the "Active Edge" is the falling edge of the CK signal the "Inactive Edge" is the rising edge of the CK signal. In this example, the operation of the Inactive Edge Router 4706 is assumed to be the same as the Falling Edge Router 1402 described in regard to FIGS. 17-23. FIG. 49A illustrates one example implementation of the Inactive Edge Router 4706 which is based on the FER 1402 architecture of FIG. 17. Using the Inactive Edge Router 4706 the Port Controller 4708 can perform an "Inactive Edge" scan operation, as previously described using "Falling Edge" scan operations, to select one or more of the Active Edge Ports to be accessed using "Active Edge" scan operations.

Figure 48:
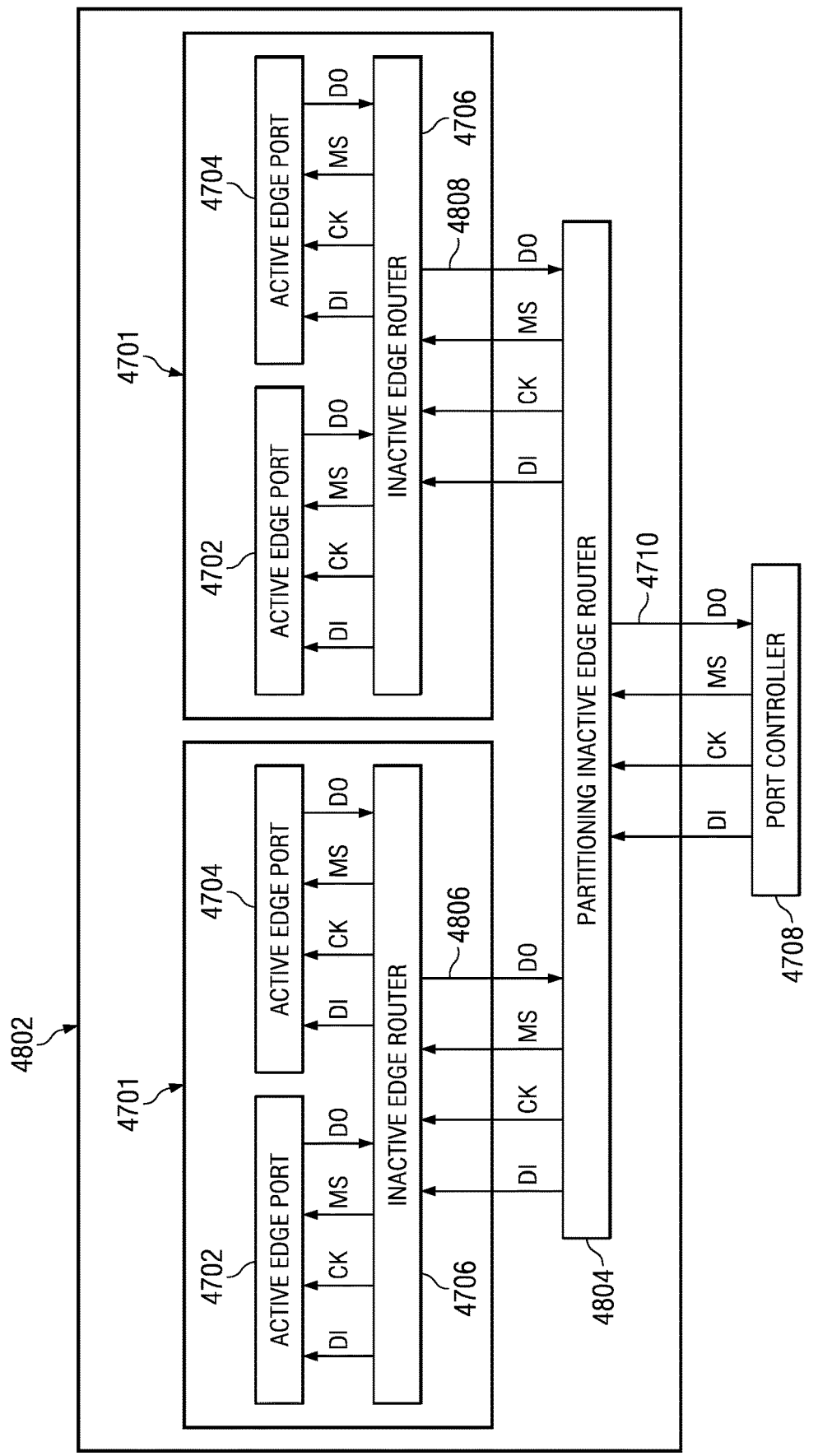
FIG. 48 illustrates a further system comprising multiple FIG. 47 systems coupled to a Port controller via a Partitioning Inactive Edge Router according to the disclosure.
Figure 49B:
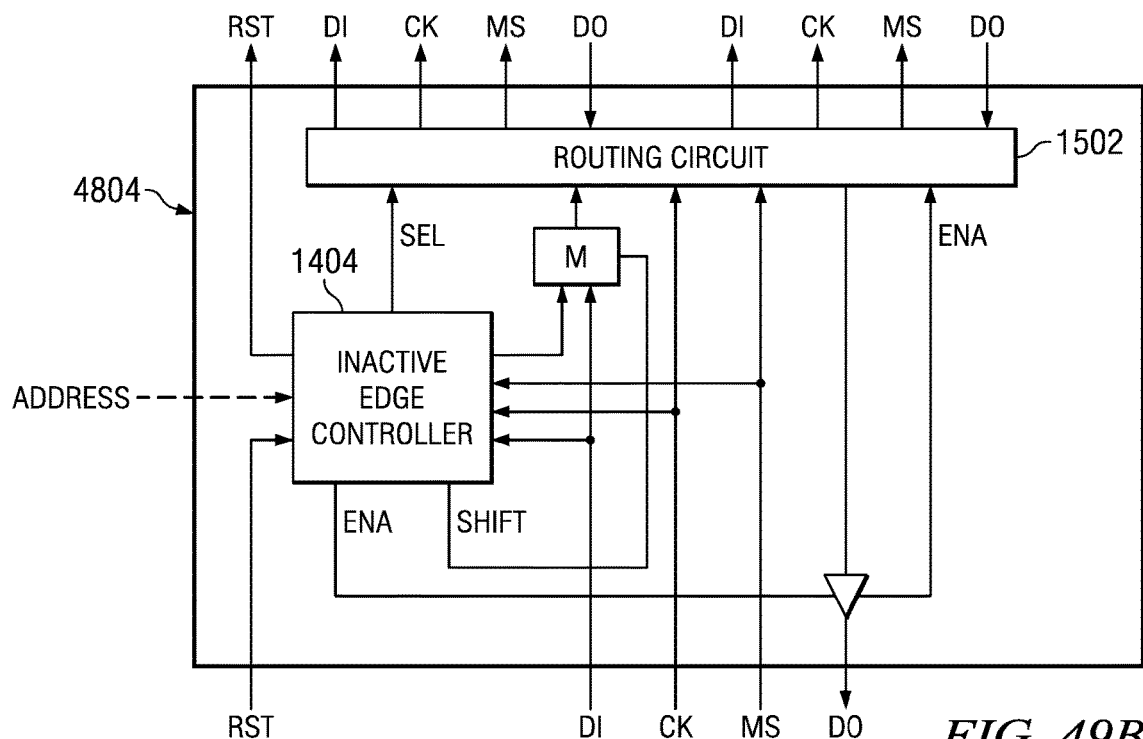
FIG. 49B illustrates an example implementation of a Partitioning Inactive Edge Router according to the disclosure.

FIG. 48 illustrates a further system 4802 comprising a Partitioning Inactive Edge Router 4804 and first and second systems 4701. The further system 4802 may be a board, an IC, or an embedded core circuit within an IC. The Port Controller 4708 is coupled to the Partitioning Inactive Edge Router 4804 via a bus 4710 comprising a DI signal, a CK signal, a MS signal, and a DO signal. The systems 4701 are coupled to the Partitioning Inactive Edge Router 4804 via buses 4806 and 4808 respectively. Each bus 4806 and 4808 comprises a DI signal, a CK signal, a MS signal, and a DO signal. The definitions of wordings "Active Edge" and "Inactive Edge" are the same as mentioned in FIG. 47. In this example, the operation of the Partitioning Inactive Edge Router 4804 is assumed to be the same as the Partitioning Falling Edge Router 2512 described in regard to FIGS. 26 and 27. FIG. 49B illustrates one example implementation of the Partitioning Inactive Edge Router 4804 which is based on the PFER 2502 architecture of FIG. 26. Using the Partitioning Inactive Edge Router 4804 the Port Controller 4708 can perform an "Inactive Edge" scan operation, as previously described using "Falling Edge" scan operations, to select one or more of the Active Edge Ports 4702-4704 in one or more of the systems 4701 to be accessed using "Active Edge" scan operations.

Figure 49C:
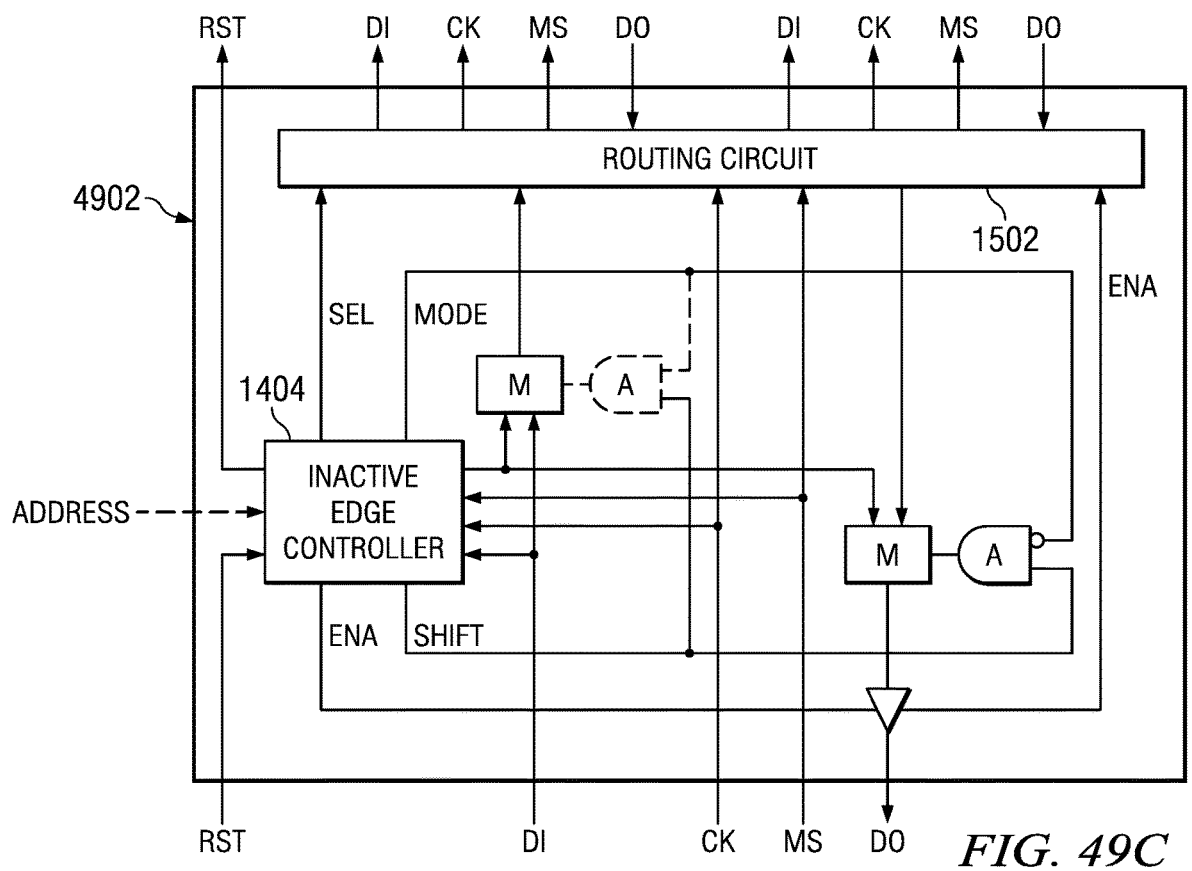
FIG. 49C illustrates an example implementation of a Configurable Inactive Edge Router according to the disclosure.

It should be understood that a Configurable Inactive Edge Router could be designed and used in place of the Inactive Edge Router 4706 and Partitioning Inactive Edge Router 4804 of FIGS. 47 and 48, as the Configurable Falling Edge Router 4102 was described replacing the Falling Edge Router 1402 and Partitioning Falling Edge Router 2512 in FIGS. 41-44. FIG. 49C illustrates one example implementation of a Configurable Inactive Edge Router 4902 which is based on the CFER 4102 architecture of FIG. 41.

The Inactive Edge Controllers 1404 in the Inactive Edge Routers of FIGS. 49A-49C will be designed to operate on the opposite clock edge that operates the Active Edge Ports 4702-4704. This can be achieved by simply including or excluding inverter 1810 of FIG. 18 on the CK input to the Inactive Edge Controllers 1404.

Although the disclosure has been described in detail, it should be understood that various changes, substitutions and alterations may be made without departing from the spirit and scope of the disclosure as defined by the appended claims.

What is claimed is:
1. A routing circuit comprising:
   (a) a first data input lead and a first test mode select input lead;
   (b) a first data output lead and a first test mode select output lead;
   (c) a second data output lead and a second test mode select output lead;
   (d) decode circuitry having a select input, an enable input, and control outputs;
   (e) first gating circuitry having a control input connected to the control outputs of the decode circuitry, having an input coupled to the first data input lead, and having an output coupled to the first data output lead;
   (f) second gating circuitry having a control input connected to the control outputs of the decode circuitry, having an input coupled to the first data input lead, and having an output coupled to the second data output lead;
   (g) third gating circuitry having a control input connected to the control outputs of the decode circuitry, having an input coupled to the first test mode select input lead, and having an output coupled to the first test mode select output lead; and
   (h) fourth gating circuitry having a control input connected to the control outputs of the decode circuitry, having an input coupled to the first test mode select input lead, and having an output coupled to the second test mode select output lead.
2. The routing circuit of claim 1 including:
   a first bus that includes the first data input lead, the first test mode select input lead, a first test clock input lead, and a first data output lead;

a second bus that includes the first data output lead, the first test mode select output lead, a first test clock output lead, and a second data input lead;

a third bus that includes the second data output lead, the second test mode select output lead, a second test clock output lead, and a third data input lead.

3. The routing circuit of claim 2 including a controller having inputs coupled to the first test data input lead, the first clock input lead, and the first test mode select input lead, and having a select output coupled to the select input of the decode circuitry, and an enable output coupled to the enable input of the decode circuitry.

4. The routing circuit of claim 2 in which:
the first gating circuitry is a multiplexer having the input coupled to the first data input lead, having an input coupled to the second data input lead, and the output coupled to the second data output lead.

5. The routing circuit of claim 2 in which:
the second gating circuitry is a multiplexer having the input coupled to the first data input lead, having an input coupled to the second data input lead, and the output coupled to a third data output lead.

6. The routing circuit of claim 1 in which the third gating circuitry is an AND gate.

7. The routing circuit of claim 1 in which the fourth gating circuitry is an AND gate.

8. The routing circuit of claim 2 including fifth gating circuitry having a control input connected to the control outputs of the decode circuitry, having an input coupled to the second data input lead, an input coupled to the third data input lead, and an output coupled to the first data output lead.

9. The routing circuit of claim 8 in which the fifth gating circuitry is a multiplexer.

* * * * *